United States Patent
Kishino

(10) Patent No.: US 10,541,672 B2
(45) Date of Patent: Jan. 21, 2020

(54) ACOUSTIC WAVE ELEMENT, DUPLEXER, AND COMMUNICATION MODULE

(71) Applicant: KYOCERA Corporation, Kyoto (JP)

(72) Inventor: Tetsuya Kishino, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/794,705

(22) Filed: Oct. 26, 2017

(65) Prior Publication Data

US 2018/0048289 A1 Feb. 15, 2018

Related U.S. Application Data

(63) Continuation of application No. 14/836,782, filed on Aug. 26, 2015, now Pat. No. 9,806,692, which is a
(Continued)

(30) Foreign Application Priority Data

Feb. 27, 2013 (JP) .................................. 2013-036663
Oct. 31, 2013 (JP) .................................. 2013-227484

(51) Int. Cl.
*H03H 9/25* (2006.01)
*H01Q 1/50* (2006.01)
(Continued)

(52) U.S. Cl.
CPC .............. *H03H 9/25* (2013.01); *H01Q 1/50* (2013.01); *H03H 9/0033* (2013.01);
(Continued)

(58) Field of Classification Search
None
See application file for complete search history.

(56) References Cited

U.S. PATENT DOCUMENTS 4,272,742 A  6/1981 Lewis
5,912,602 A  6/1999 Takagi et al.
(Continued)

FOREIGN PATENT DOCUMENTS

JP  2000-31778 A  1/2000
JP  2006-13576 A  1/2006
(Continued)

OTHER PUBLICATIONS

International Search Report dated Apr. 1, 2014, issued for International Application No. PCT/JP2014/054889.
(Continued)

*Primary Examiner* — Trinh V Dinh
(74) *Attorney, Agent, or Firm* — Procopio Cory Hargreaves and Savitch LLP

(57) ABSTRACT

An acoustic wave element of the present disclosures has a piezoelectric substrate and an acoustic wave resonator on a main surface of the piezoelectric substrate. The acoustic wave resonator is one being divided into a first IDT electrode and a second IDT electrode which are electrically connected to the first IDT electrode. The first IDT electrode includes a first comb-shaped electrode on the signal input side and a second comb-shaped electrode on the signal output side. The second IDT electrode includes a third comb-shaped electrode on the signal input side and a fourth comb-shaped electrode on the signal output side. The direction of arrangement of the third comb-shaped electrode and the fourth comb-shaped electrode from the third comb-shaped electrode toward the fourth comb-shaped electrode is different from the direction of arrangement from the first comb-shaped electrode toward the second comb-shaped electrode.

4 Claims, 24 Drawing Sheets

Related U.S. Application Data continuation-in-part of application No. PCT/JP2014/054889, filed on Feb. 27, 2014.

(51) Int. Cl.
 H03H 9/00 (2006.01)
 H03H 9/02 (2006.01)
 H03H 9/72 (2006.01)

(52) U.S. Cl.
 CPC .... H03H 9/02614 (2013.01); H03H 9/02913 (2013.01); H03H 9/02992 (2013.01); H03H 9/725 (2013.01)

(56) References Cited

U.S. PATENT DOCUMENTS

| | | | |
|---|---|---|---|
| 9,806,692 B2* | 10/2017 | Kishino | ............... H03H 9/0033 |
| 2002/0063612 A1 | 5/2002 | Takamine | |
| 2003/0155993 A1 | 8/2003 | Takamine et al. | |
| 2007/0279157 A1 | 12/2007 | Bauer | |
| 2008/0007370 A1 | 1/2008 | Matsumoto | |
| 2008/0055021 A1 | 3/2008 | Ueda | |
| 2011/0043075 A1 | 2/2011 | Okumichi | |
| 2012/0098618 A1 | 4/2012 | Tanaka | |
| 2012/0126913 A1 | 5/2012 | Hara et al. | |
| 2012/0146746 A1 | 6/2012 | Shimozono | |
| 2016/0049920 A1* | 2/2016 | Kishino | ............... H03H 9/0033 343/858 |
| 2016/0118956 A1 | 4/2016 | Kihara | |

FOREIGN PATENT DOCUMENTS

| | | |
|---|---|---|
| JP | 2006-080873 A | 3/2006 |
| JP | 2007-19975 A | 1/2007 |
| JP | 2007-208690 A | 8/2007 |
| JP | 2009-296086 A | 12/2009 |
| JP | 2010-21914 A | 1/2010 |
| JP | 2010-103951 A | 5/2010 |
| JP | 2010-278830 A | 12/2010 |
| JP | 2012-147175 A | 8/2012 |
| WO | 2011/016332 A1 | 2/2011 |

OTHER PUBLICATIONS

The extended European search report dated Jul. 15, 2016 issued by the European Patent Office in counterpart European Patent Application No. 14 75 7259.8.

Office Action dated Jul. 5, 2016 issued by the Japan Patent Office in corresponding Japanese Patent Application No. 2015-184358.

Communication pursuant to Article 94(3) EPC dated Dec. 12, 2017, issued by the European Patent Office in counterpart European Patent Application No. 14 757259.8.

* cited by examiner

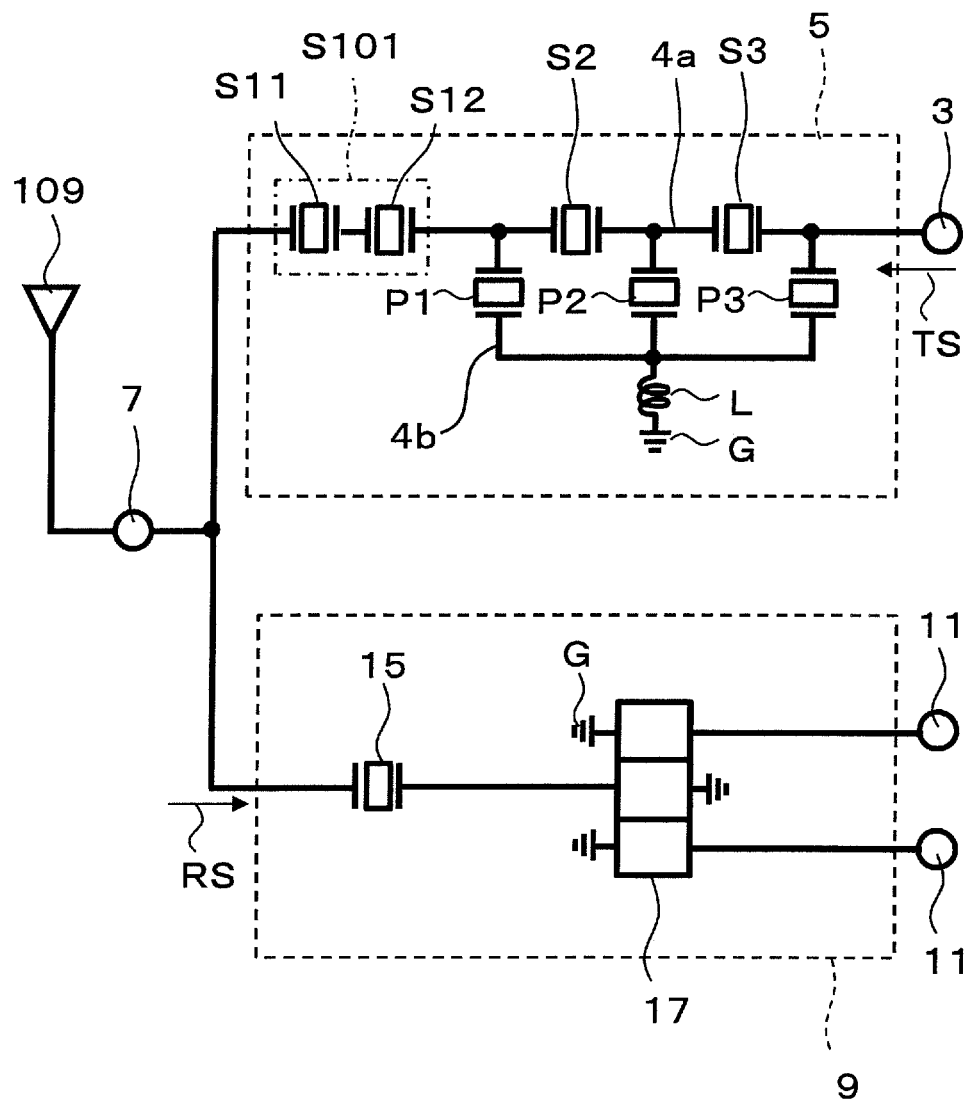

US 10,541,672 B2

ACOUSTIC WAVE ELEMENT, DUPLEXER, AND COMMUNICATION MODULE

CROSS-REFERENCE TO RELATED APPLICATIONS

The present application is a continuation of U.S. application Ser. No. 14/836,782 filed on Aug. 26, 2015 which is a bypass continuation in part of International Application No. PCT/JP2014/054889, filed on Feb. 27, 2014, which claims the benefit of Japanese Application No. 2013-036663, filed on Feb. 27, 2013, and Japanese Application No. 2013-227484, filed on Oct. 31, 2013. The contents of the above applications are incorporated by reference herein in their entirety.

TECHNICAL FIELD

The embodiments of the present disclosure relate to an acoustic wave element such as a surface acoustic wave (SAW) element or the like, a duplexer, and a communication module.

BACKGROUND

Known in the art is an acoustic wave element having a piezoelectric substrate and excitation IDT electrode (Inter-Digital Transducer) electrode provided on the main surface of the piezoelectric substrate. Such an acoustic wave element is for example utilized for a transmission filter, reception filter, and so on in a duplexer.

In an acoustic wave element, an electrical distorted signal (distorted wave) which is generated due to nonlinearity of the element sometimes may cause the electrical characteristics to fall. For example, in a duplexer using an acoustic wave element, an out-of-band interfering wave out of the transmission band and reception band and a transmission wave may be mixed, so a distorted wave contained in the reception band may be generated. This distorted wave is called "inter-modulation distortion (IMD)" and may be one of the causes of a drop in the communication quality (SN ratio) of wireless communication apparatuses. Other than this, there also may exist the possibility of the problem that harmonic distortion having a frequency of a whole multiple of the transmission wave is generated and this harmonic distortion hinders the communication of other wireless communication apparatuses.

As a method for reducing the drop in the SN ratio due to such a distorted wave, there is known the method for dividing the serial resonators or parallel resonators of a ladder type filter configuring the duplexer without changing the electrostatic capacity. This reduces the distorted wave by dividing the serial resonators or parallel resonators and thereby dispersing the voltage applied to the resonators.

SUMMARY

An acoustic wave element, duplexer, and communication module are disclosed.

An acoustic wave element of an embodiment of some disclosures has a piezoelectric substrate and an acoustic wave resonator on a main surface of the piezoelectric substrate. The acoustic wave resonator is one being divided into a first IDT electrode and a second IDT electrode which is electrically connected to the first IDT electrode. The first IDT electrode includes a first comb-shaped electrode on the signal input side and a second comb-shaped electrode on the signal output side. The second IDT electrode includes a third comb-shaped electrode on the signal input side and a fourth comb-shaped electrode on the signal output line. The direction of arrangement of the third comb-shaped electrode and the fourth comb-shaped electrode from the third comb-shaped electrode toward the fourth comb-shaped electrode is different from the direction of arrangement from the first comb-shaped electrode toward the second comb-shaped electrode.

A duplexer according to an embodiment of some disclosures is a duplexer has an antenna terminal, a transmission filter which filters a transmission signal and outputs the result to the antenna terminal, and a reception filter which filters a reception signal from the antenna terminal. The transmission filter has the above acoustic wave element.

A communication module according to an embodiment of some disclosures has an antenna, the above duplexer which is electrically connected to the antenna, and an RF-IC which is electrically connected to the duplexer.

According to the above configurations, there are provided an acoustic wave element, duplexer, and communication module capable of reducing deterioration of electrical characteristics caused by a distorted wave.

BRIEF DESCRIPTION OF DRAWINGS

FIGS. 5A to 5C are illustrations of are diagrams for explaining a mechanism of generation of a distorted wave, wherein FIG. 5A is an enlarged view of a region V in FIG. 3, FIG. 5B is a cross-sectional view taken along a B-B' line in FIG. 5A, and FIG. 5C is a cross-sectional view taken along a C-C' line in FIG. 5A.

FIG. 6 an illustration of is a circuit diagram which shows a configuration of a duplexer according to a second embodiment of the disclosure.

FIGS. 13A and 13B show modifications of a SAW element according to an embodiment of the disclosure, in which FIG. 13A shows the case where IDT electrodes are connected in parallel, and FIG. 13B shows the case where IDT electrodes are connected in series.

DETAILS OF DESCRIPTION

Below, an acoustic wave element (hereinafter, also referred to as a SAW element) and a duplexer according to embodiments of the some disclosures will be explained with reference to the drawings Note that, the drawings used in the following explanation are diagrammatical ones, and dimensions, ratios, etc. on the drawings do not always coincide with the actual ones. Further, in the second and following embodiments, for the configurations which are the same as or similar to the configurations of the already explained embodiments, the same notations as those in the already explained embodiments will be attached and the explanations will sometimes be omitted.

Figure 1:
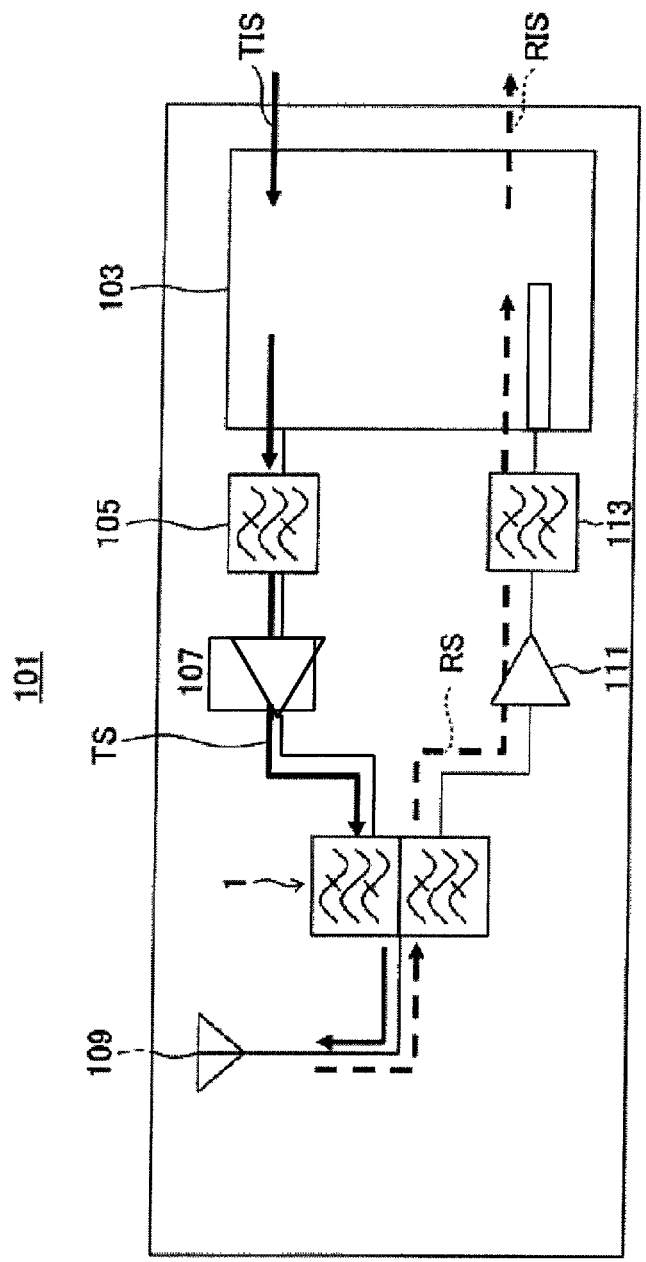
FIG. 1 is an illustration of a block diagram which shows a configuration of a signal processing system of a communication module according to an embodiment of the disclosure.

FIG. 1 is a block diagram which shows a principal part of a communication module 101 according to an embodiment of the disclosure. The communication module 101 is for performing wireless communication utilizing radio waves. A duplexer 1 has a function of separating a signal having a transmission frequency and a signal having a reception frequency at the communication module 101.

In the communication module 101, a transmission information signal TIS containing information to be transmitted is modulated and boosted in frequency (conversion of carrier frequency to high frequency signal) by an RF-IC 103 to become a transmission signal TS. The transmission signal TS is stripped of unwanted components out of the pass band for transmission by a band pass filter 105, amplified by an amplifier 107, and input to the duplexer 1. The duplexer 1 eliminates the unwanted components out of the pass band for transmission from the transmission signal TS which is input and outputs the result to the antenna 109. The antenna 109 converts the input electrical signal (transmission signal TS) to a wireless signal and transmits the same.

In the communication module 101, a wireless signal received by the antenna 109 is converted to an electrical signal (reception signal RS) by the antenna 109 and is input to the duplexer 1. The duplexer 1 strips unwanted components out of the pass band for reception from the reception signal RS which is input and outputs the result to the amplifier 111. The output reception signal RS is amplified by the amplifier 111 and is stripped of unwanted components out of the pass band for reception by the band pass filter 113. Then, the reception signal RS is boosted down in frequency and is demodulated by the RF-IC 103 to become the reception information signal RIS.

Note that, the transmission information signal TIS and reception information signal RIS may be low frequency signals (baseband signals) which contain suitable information. For example, they may be analog audio signals or digitalized audio signals. The passband of the radio signal may be one according to various standards such as the UMTS (Universal Mobile Telecommunications System). The modulation scheme may be any of phase modulation, amplitude modulation, frequency modulation, or a combination of two or more types selected from these. As the circuit system, FIG. 1 illustrated a direct conversion system, but it may be a suitable one other than this. For example, it may be a double super heterodyne system as well. Further, FIG. 1 diagrammatically shows only the principal parts. Therefore, a low pass filter or isolator etc. may be added at a suitable position, or the positions of the amplifier etc. may be changed as well.

Figure 2:
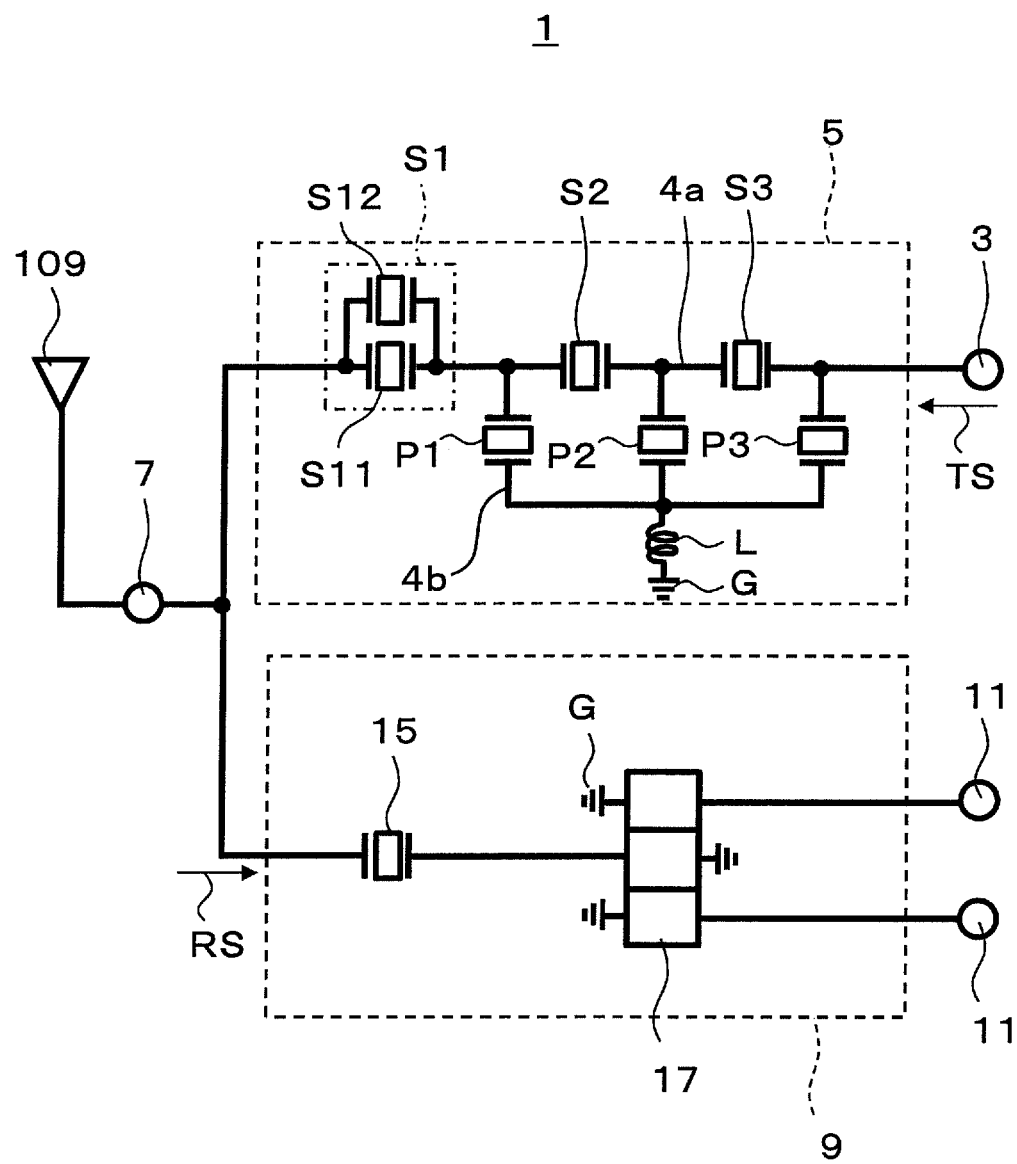
FIG. 2 is an illustration of a circuit diagram which shows a configuration of a duplexer according to a first embodiment of the disclosure.

FIG. 2 is a circuit diagram which shows the configuration of the duplexer 1 according to the first embodiment of the disclosure. The duplexer 1 is the duplexer used in the communication module 101 in FIG. 1.

The duplexer 1 is mainly configured by an antenna terminal 7, transmission terminal 3, reception terminal 11, transmission filter 5 which is arranged between the antenna terminal 7 and the transmission terminal 3, and reception filter 9 which is arranged between the antenna terminal 7 and the reception terminal 11.

The transmission terminal 3 receives as input the transmission signal TS from the amplifier 107. The transmission signal TS which is input to the transmission terminal 3 is stripped of unwanted components out of the pass band for transmission in the transmission filter 5 and is output to the antenna terminal 7.

Further, the antenna terminal 7 receives as input the reception signal RS from the antenna 109. This is stripped of unwanted components out of the pass band for reception in the reception filter 9 and is output to the reception terminal 11.

The transmission filter 5 is for example configured by a ladder type SAW filter. Specifically, the transmission filter 5 has three serial resonators S1, S2, and S3 which are connected in series between the input side and the output side thereof and three parallel resonators P1, P2, and P3 which are provided at a parallel arm 4b between an interconnect for connecting the serial resonators S1 to S3 to each other, defined as a "serial arm 4a", and a reference potential portion G. That is, the transmission filter 5 is a ladder type filter having a 3-stage configuration. Note, in the transmission filter 5, the number of stages of the ladder type filter may be any number.

Between the parallel resonators P1, P2, and P3, and the reference potential portion G, an inductor L is provided. By setting the inductance of this inductor L at a predetermined magnitude, an attenuation pole is formed outside the band of the pass frequency of the transmission signal thereby increasing the out-band attenuation.

Each of the plurality of serial resonators S1, S2, and S3 and the plurality of parallel resonators P1, P2, and P3 is configured by a SAW resonator. Among these resonators, each of the resonators other than the serial resonator S1 is configured by a single SAW resonator. On the other hand, the serial resonator S1 is configured by two SAW resonators. Specifically, the serial resonator S1 is configured by a SAW resonator S11 and a SAW resonator S12 which are connected in parallel to each other.

Note that, it can be deemed that the serial resonator S1 is configured by two SAW resonators S11 and S12 as explained above or can be deemed that one SAW resonator S11 configures the serial resonator S1, and the other SAW resonator S12 is connected in parallel to the serial resonator S1. This depends on whether the filter is designed while deeming the two SAW resonators S11 and S12 together as a single serial resonator or whether the filter is designed while making the two SAW resonators S11 and S12 separate.

The reception filter 9 for example has a multiplex mode type SAW filter 17 and an auxiliary resonator 15 which is connected in series to the input side of that Note that, in the present embodiment, the "multiplex mode" includes a double mode. The multiplex mode type SAW filter 17 has a balanced-unbalanced conversion function. The reception filter 9 is connected to the two reception terminals 11 to which the balanced signals are output. The reception filter 9 is not limited to one configured by a multiplex mode type SAW filter 17 and may be configured by a ladder type filter or may be a filter which does not have a balanced-unbalanced conversion function.

Between the connecting point of the transmission filter 5, reception filter 9, and antenna terminal 7 and the ground potential portion G, an impedance matching-use circuit configured by an inductor or the like may be inserted as well.

Figure 3:
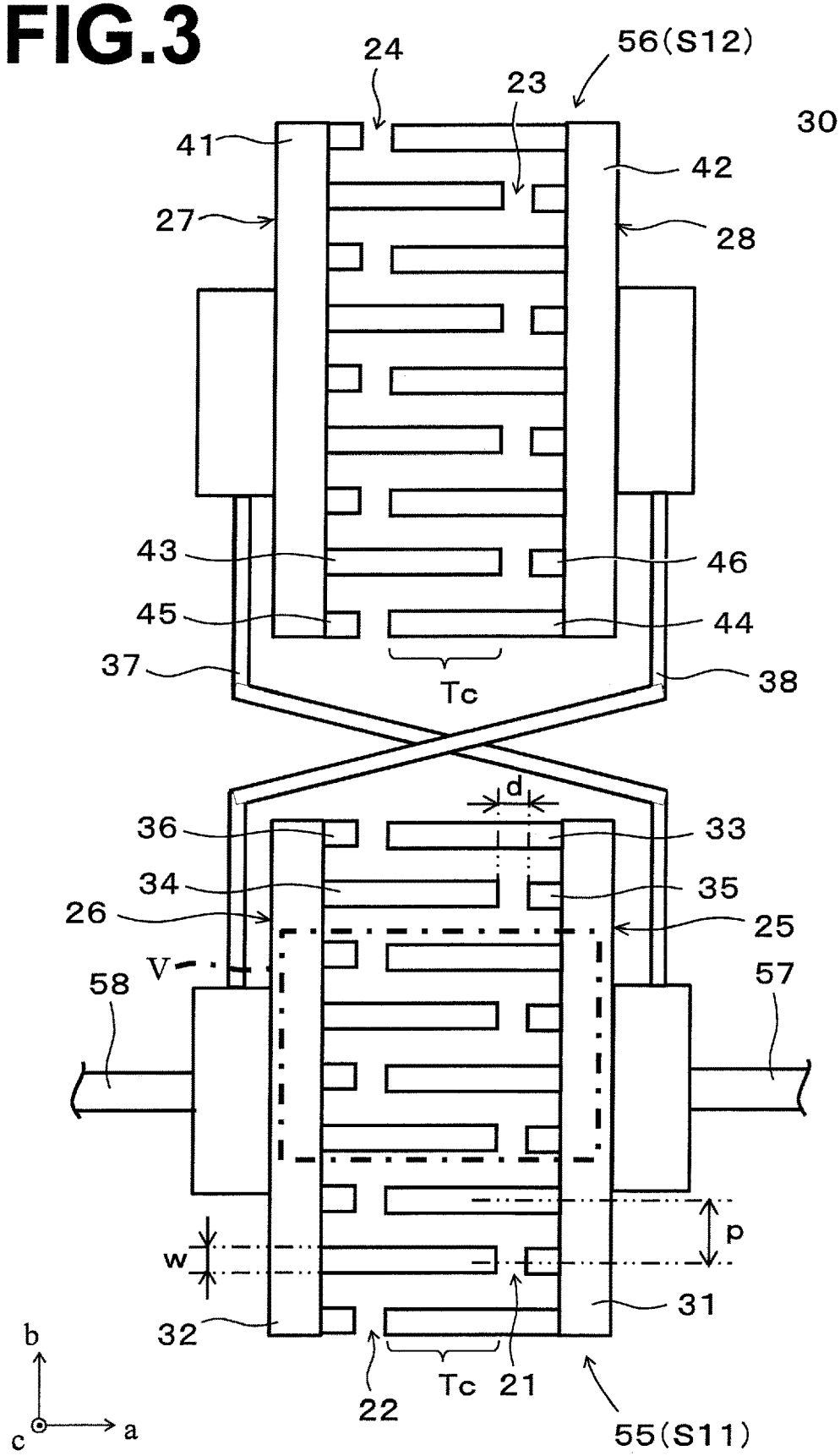
FIG. 3 is an illustration of a plan view which shows a portion of a SAW element according to the first embodiment of the disclosure.

FIG. 3 is a plan view which shows a portion of a SAW element 51 according to the first embodiment of the present disclosure. The SAW element 51 for example configures a ladder type filter circuit of the transmission filter 5 in the duplexer 1 shown in FIG. 2 and has a piezoelectric substrate 30 and serial resonators S1 to S3 and parallel resonators P1 to P3 which are formed on the piezoelectric substrate 30. FIG. 3 shows only the portion of the serial resonator S1. Further, in FIG. 3, substantially the entire surface of the drawing sheet is regarded as the main surface of the piezoelectric substrate 30, and the periphery of the piezoelectric substrate 30 is not shown.

In the SAW element 51, any direction may be defined as upward or downward. In the following description, however, for convenience, an orthogonal coordinate system abc will be defined, and use will be made of "upper surface", "lower surface", or other terms where the positive side of the c-direction (front side of the drawing sheet in FIG. 3) is defined as "upward".

The serial resonator S1 is for example configured as a 1-port SAW resonator. The serial resonator S1 is mainly configured by the piezoelectric substrate 30, first IDT electrode 55 (S11), and second IDT electrode 56 (S12) which is connected in parallel to the first IDT electrode 55. To the first IDT electrode 55, a signal input line 57 and a signal output line 58 are connected. The first IDT electrode 55 is configured by a pair of first and second comb-shaped electrodes 25 and 26, while the second IDT electrode 56 is configured by a pair of third and fourth comb-shaped electrodes 27 and 28.

Note that, the first and third comb-shaped electrodes 25 and 27 are the comb-shaped electrodes on the side at which the signal is input. The second and fourth comb-shaped electrodes 26 and 28 are the comb-shaped electrodes on the side at which the signal is output.

The serial resonator S1 has reflector electrodes which are arranged so as to sandwich each of the first IDT electrode 55 and the second IDT electrode 56 from the two sides in the direction of propagation of the SAW, but the illustration of the reflector electrodes is omitted in FIG. 3. Note that, the reflector electrodes need not be provided either. Other than this, the serial resonator S1 has a protective layer covering the IDT electrodes etc., but the illustration is omitted also for this.

The piezoelectric substrate 30 is for example a lithium tantalate (LiTaO3) single crystal, lithium niobate (LiNbO3) single crystal, or other single crystal substrate having piezoelectricity. More specifically, use can be made of a 42°±10° Y-X cut LiTaO3, 128°±10° Y-X cut LiNbO3 substrate, or 0°±10° Y-X cut LiNbO3 substrate. The planar shape and various dimensions of the piezoelectric substrate 30 may be suitably set. Note that, the LiTaO3 single crystal and LiNbO3 single crystal exhibit a large nonlinearity in the Z-axis direction. For this reason, in the rotated Y cut-X propagated SAW, in a case where an electric field is applied to the horizontal direction of the substrate or depth direction of the substrate which are perpendicular to the direction of propagation of the SAW (X-axis direction), a large distortion is easily generated according to the Z-axis direction component of the electric field In this way, the crystal axes of the piezoelectric substrate 30 will be defined as an X-axis, Y-axis, and Z-axis.

The protective layer covering the IDT electrode 55 etc. is made of an insulation material. Specifically, this is made of silicon oxide, nitrogen oxide, or the like.

Next, an example of a specific configuration of the first IDT electrode 55 and second IDT electrode 56 will be explained below.

The pair of first and second comb-shaped electrodes 25 and 26 configuring the first IDT electrode 55 are mainly configured by a first bus bar electrode 31, second bus bar electrode 32, a plurality of first electrode fingers 33, a plurality of second electrode fingers 34, a plurality of first dummy electrode fingers 35, and a plurality of second dummy electrode fingers 36.

The first and second bus bar electrodes 31 and 32 are for example long in shape and linearly extend in the direction of propagation of the SAW (b-direction) with a constant width. The first bus bar electrode 31 and the second bus bar electrode 32 face each other in the direction (a-direction) perpendicular to the direction of propagation of the SAW. Further, the first bus bar electrode 31 and the second bus bar electrode 32 are parallel to each other at their inside side surfaces which face each other. The distance between the two side surfaces is constant in the direction of propagation of the SAW.

The plurality of first electrode fingers 33 and plurality of first dummy electrode fingers 35 are connected to the first bus bar electrode 31. The plurality of second electrode fingers 34 and plurality of second dummy electrode fingers 36 are connected to the second bus bar electrode 32.

The plurality of first and second electrode fingers 33 and 34 linearly extend in the direction (a-direction) perpendicular to the direction of propagation of the SAW with roughly constant widths. The plurality of first and second electrode fingers 33 and 34 are arranged at constant intervals along the direction of propagation of the SAW (b-direction). One first electrode finger 33 and one second electrode finger 34 adjacent to the first electrode finger 33 have portions which are side by side in the b-direction. A region obtained by extending the portion along the direction of propagation of the SAW, in which portion one first electrode finger 33 and one second electrode finger 34 adjacent to the first electrode finger 33 are side by side in the b-direction, will be referred to as a "crossing region Tc".

The plurality of first and second electrode fingers 33 and 34 are provided so that their pitch "p" (repetition interval) for example becomes equal to a half wavelength of the wavelength $\lambda$ of the SAW at the frequency so as to cause resonance. The pitch "p" is for example defined according to the distance between the centers of one first electrode finger 33 and one second electrode finger 34 which are adjacent to each other. The wavelength $\lambda$ of SAW is for example 1 5 μm to 6 μm.

The first and second electrode fingers 33 and 34 are for example set the same as each other at the length and width "w" corresponding to one of them. Note that, these dimensions are suitably set in accordance with the electrical characteristics etc. which are demanded from the SAW element 51. The width "w" corresponding to one of the first and second electrode fingers 33 and 34 is for example 0 4p to 0 7p with respect to the pitch "p" of the first electrode finger 33 and second electrode finger 34.

The first dummy electrode fingers 35 are arranged at schematically the centers between the plurality of first electrode fingers 33. In the same way, the second dummy electrode fingers 36 are arranged at schematically the centers between the plurality of second electrode fingers 34. The width corresponding to one of the first and second dummy electrode fingers 35 and 36 is for example equal to the width "w" corresponding to one of the first and second electrode fingers 33 and 34. The length corresponding to one of the first and second dummy electrode fingers 35 and 36 is shorter than that of the first and second electrode fingers 33 and 34. Note that, the first and second comb-shaped electrodes 25 and 26 need not have the plurality of first and second dummy electrode fingers 35 and 36 either.

The front ends of the first dummy electrode fingers 35 face the front ends of the second electrode fingers 34 through first gaps 21. Further, the front ends of the second dummy electrode fingers 36 face the front ends of the first electrode fingers 33 through second gaps 22.

The number of the plurality of first gaps 21 is set the same as the number of the plurality of first dummy electrode fingers 35. In the same way, the number of the plurality of second gaps 22 is set the same as the number of the plurality of second dummy electrode fingers 36. Further, the width of each of the plurality of first and second gaps 21 and 22 is the same as the width "w" of each of the plurality of first and second electrode fingers 33 and 34. The lengths "d" (hereinafter, sometimes referred to as the gap lengths "d") of the first and second gaps 21 and 22 are the same as each other among the plurality of first gaps 21 and among the plurality of second gaps 22 and are the same as each other between the first gaps 21 and the second gaps 22. That is, in the SAW element 51, the gap lengths "d" of all of the first and second gaps 21 and 22 are set the same. The gap lengths "d" of the first and second gaps 21 and 22 are suitably set in accordance with the electrical characteristics etc. which are demanded from the SAW element 51 and are for example 0 1$\lambda$ to 0 6$\lambda$.

The signal input line 57 and signal output line 58 are connected to the first IDT electrode 55. The signal input line 57 is the line for inputting the transmission signal TS into the first IDT electrode 55 and second IDT electrode 56. This signal input line 57 configures the serial arm 4a connecting the serial resonators S1 to S3 in FIG. 2. The signal input line 57 is connected to the first bus bar electrode 31 in the first IDT electrode 55.

On the other hand, the signal output line 58 is the line for outputting the transmission signal TS from the first IDT electrode 55 and second IDT electrode 56. This signal output line 58 configures the serial arm 4a connecting the serial resonator S1 and the antenna terminal 7 in FIG. 2. The signal output line 58 is connected to the second bus bar electrode 32 in the first IDT electrode 55.

The second IDT electrode 56 is connected in parallel with respect to the first IDT electrode 55. The third comb-shaped electrode 27 is mainly configured by a third bus bar electrode 41, a plurality of third electrode fingers 43, and a plurality of third dummy electrode fingers 45. The fourth comb-shaped electrode 28 is mainly configured by a fourth bus bar electrode 42, a plurality of fourth electrode fingers 44, and a plurality of fourth dummy electrode fingers 46. Note that, the third and fourth comb-shaped electrodes 27 and 28 need not have the plurality of third and fourth dummy electrode fingers 45 and 46 either.

The third and fourth bus bar electrodes 41 and 42 are for example long in shape and linearly extend in the direction of propagation of the SAW (b-direction) with constant widths. The third bus bar electrode 41 and the fourth bus bar electrode 42 face each other in the direction (a-direction) perpendicular to the direction of propagation of the SAW. Further, the third bus bar electrode 41 and the fourth bus bar electrode 42 are parallel to each other at their inside side surfaces which face each other. The distance between the two side surfaces is constant in the direction of propagation of the SAW.

The third bus bar electrode 41 is connected to the plurality of third electrode fingers 43 and plurality of third dummy electrode fingers 45. The fourth bus bar electrode 42 is connected to the plurality of fourth electrode fingers 44 and plurality of fourth dummy electrode fingers 46.

The pluralities of third and fourth electrode fingers 43 and 44 linearly extend in the direction (a-direction) perpendicular to the direction of propagation of the SAW with roughly constant widths. The pluralities of third and fourth electrode fingers 43 and 44 are arranged at constant intervals along the direction of propagation of the SAW (b-direction). A third electrode finger 43 and a fourth electrode finger 44 adjacent to the third electrode finger 43 have portions (crossing regionTc) which adjoin each other in the b-direction. The pitch "p" and width "w" of the third and fourth electrode fingers 43 and 44 are basically set the same as the pitch "p" and width "w" of the first and second electrode fingers 33 and 34.

The third dummy electrode fingers 45 are arranged at the centers between the plurality of electrode fingers 43. In the same way, the fourth dummy electrode fingers 46 are arranged at the centers between the plurality of fourth electrode fingers 44. The width of each of the third and fourth dummy electrode fingers 45 and 46 is for example the same as the width "w" of the third and fourth electrode fingers 43 and 44. The lengths of the third and fourth dummy electrode fingers 45 and 46 are shorter than the lengths of the third and fourth electrode fingers 43 and 44.

The front end of a third dummy electrode finger 45 faces the front end of a fourth electrode finger 44 through a third gap 23. Further, the front end of a fourth dummy electrode finger 46 faces the front end of a third electrode finger 43 through a fourth gap 24.

The number of the plurality of third gaps 23 is the same as the number of the plurality of third dummy electrode fingers 45. In the same way, the number of the plurality of fourth gaps 24 is the same as the number of the plurality of fourth dummy electrode fingers 46.

Further, the width "w" of each of the plurality of third and fourth gaps 23 and 24 is the same as the width "w" of each of the plurality of third and fourth electrode fingers 43 and 44. The gap lengths "d" of the plurality of third and fourth gaps 23 and 24 are for example the same as each other among the plurality of third gaps 23 and among the plurality of fourth gaps 24 and are the same between the third gaps 23 and the fourth gaps 24.

In the SAW element 51, the first IDT electrode 55 and second IDT electrode 56 are formed so that both of their shapes and sizes become roughly equal to each other. That is, the first IDT electrode 55 and second IDT electrode 56 are formed so that the two IDT electrodes are superimposed on each other when the second IDT electrode 56 is moved in parallel and is superimposed on the first IDT electrode 55 in the up-down direction. Here, the shapes and sizes of the IDT electrodes being roughly equal means they are made the same in design. Even if there is a little difference in the shapes and sizes of the two IDT electrodes due to variations in production or the like, this is included within the same range. Further, from the viewpoint of reducing the influence of a distorted wave generated in the IDT electrodes as will be explained later, the shapes and sizes of at least the portions in the IDT electrodes excluding the bus bar electrodes, that is, the electrode fingers and dummy electrode fingers, only have to be roughly equal between the first IDT electrode 55 and the second IDT electrode.

The first and second IDT electrodes 55 and 56 are for example formed by metal. As this metal, there can be mentioned for example Al or an alloy containing Al as a principal ingredient (Al alloy). As the Al alloy, for example, use can be made of an Al—Cu alloy. Note that, the first and second IDT electrodes 55 and 56 may be configured by a plurality of metal layers as well. The thicknesses of the first and second IDT electrodes 55 and 56 may be suitably set. Since the first IDT electrode 55 and second IDT electrode 56 are formed by the same material and in the same process, the thicknesses of the first IDT electrode 55 and second IDT electrode 56 are set so as to become roughly the same.

When an AC voltage is applied to the piezoelectric substrate 30 by the first and second IDT electrodes 55 and 56, a SAW propagated in the b-direction along the upper surface is induced near the upper surface of the piezoelectric substrate 30. By the induced SAW, at each of the first and second IDT electrodes 55 and 56, a standing wave in which the pitch "p" of the first and second IDT electrodes 55 and 56 is the half-wave length is formed. The standing wave is converted to an electrical signal having the same frequency as that of the standing wave and then is output. In this way, the serial resonator S1 functions as a resonator.

The second IDT electrode 56 is connected in parallel with respect to the first IDT electrode 55, but the serial resonator S1 reduces the distorted wave which is generated in the serial resonator S1 by setting the connection between the first IDT electrode 55 and the second IDT electrode 56 to a mode which is different from the normal one. That is, the first IDT electrode 55 and the second IDT electrode 56 are electrically connected so that the direction of arrangement from the third comb-shaped electrode 27 toward the fourth comb-shaped electrode 28 is different from the direction of arrangement from the first comb-shaped electrode 25 toward the second comb-shaped electrode 26.

Specifically, as shown in FIG. 3, the first bus bar electrode 31 of the first IDT electrode 55 and the third bus bar electrode 41 of the second IDT electrode 56 are electrically connected, while the second bus bar electrode 32 of the first IDT electrode 55 and the fourth bus bar electrode 42 of the second IDT electrode 56 are electrically connected. What connects the bus bar electrodes of the first and second IDT electrodes 55 and 56 to each other so that they cross each other is the serial resonator S1 according to the present embodiment.

At this time, the direction of the front end of a first electrode finger 33 facing the front end of a second dummy electrode finger 36 through the second gap 22 in the first IDT electrode 55 and the direction of the front end of a third electrode finger 43 facing the front end of a fourth dummy electrode finger 46 through the fourth gap 24 in the second IDT electrode 56 become inverse directions to each other. In the same way, the direction of the front end of a first dummy electrode finger 35 facing the front end of a second electrode finger 34 through the first gap 21 in the first IDT electrode 55 and the direction of the front end of a third dummy electrode finger 45 facing the front end of a fourth electrode finger 44 through the third gap 23 in the second IDT electrode 56 are inverse to each other.

In the SAW element 51, electrical connection between the bus bar electrodes is achieved through the interconnect lines. Specifically, the first bus bar electrode 31 is connected through the first interconnect line 37 to the third bus bar electrode 41, and the second bus bar electrode 32 is connected through the second interconnect line 38 to the forth bus bar electrode 42

The first interconnect line 37 and the second interconnect line 38 cross each other three-dimensionally in a region between the first IDT electrode 55 and the second IDT electrode 56. In the portion where the two interconnect lines cross three-dimensionally, short-circuiting of the two interconnect lines is prevented by interposing resin or another insulation material between them. By employing such a three-dimensional crossing line structure, the predetermined bus bar electrodes can be connected to each other without routing the first interconnect line 37 or second interconnect line 38 around the outsides of the IDT electrodes. Due to this, the space required for laying the interconnect lines becomes small, therefore the SAW element 51 can be made smaller in size.

Here, a distorted current, which becomes the cause of the distorted wave generated in the IDT electrodes, will be explained. The mechanism of generation of the distorted current in the IDT electrodes is considered to be the result of two factors, i.e., electrical distortion and mechanical distortion.

Figure 5A:
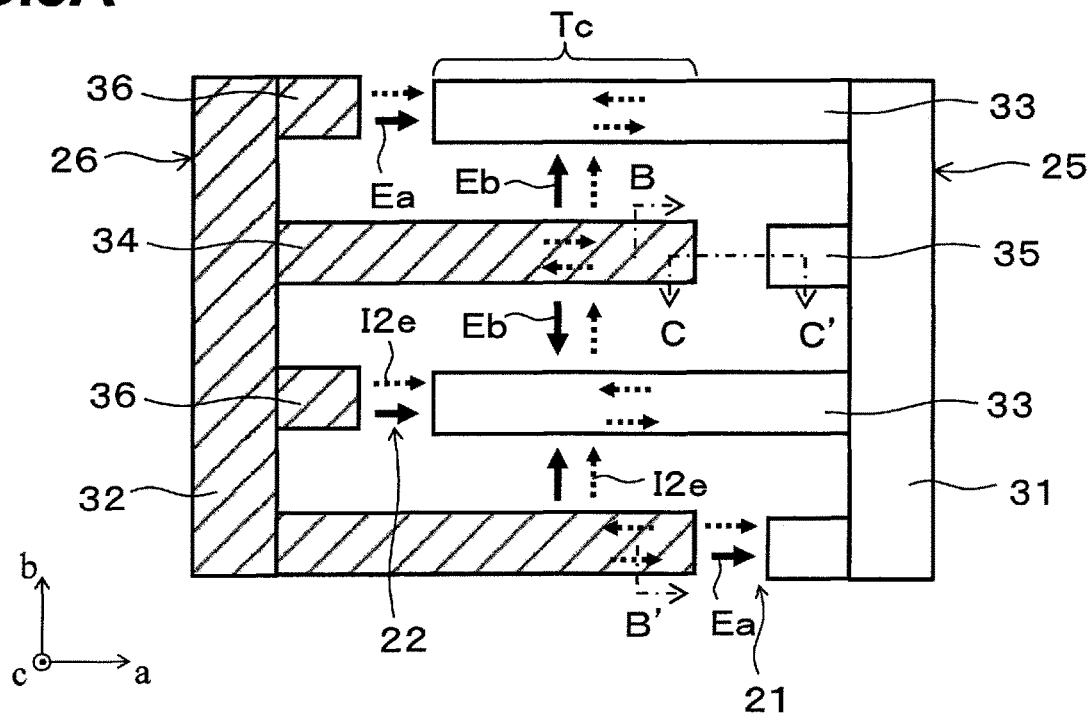

First, the distorted wave caused by electrical distortion will be explained by using FIG. 5A. FIG. 5A is an enlarged diagram of a region V in FIG. 3. In FIG. 5A, assume that the hatched second comb-shaped electrode 26 is in a higher potential state than the non-hatched first comb-shaped electrode 25. At this time, between the first comb-shaped electrode 25 and the second comb-shaped electrode 26, electric fields E are generated in the directions indicated by black arrows. That is, in the crossing region Tc of the electrode fingers, an electric field Eb along the direction of propagation of the SAW (b-direction) is generated, while in the first and second gaps 21 and 22, an electric field Ea along the direction (a-direction) perpendicular to the direction of propagation of the SAW is generated.

When such an electric field is generated, a distorted current is generated due to the nonlinearity of the dielectric ratio ε of the piezoelectric substrate 30. In the distorted current, a current I2e due to the second order nonlinearity is proportional to the square of the electric field E. That is, a distorted current I2e represented by an equation such as "I2e=αE2" is generated. α is a coefficient depending upon the crystal orientation of the piezoelectric substrate 30. It is considered that the direction of the distorted current I2e depends upon the crystal orientation of the piezoelectric substrate 30 and is proportional to the square of the electric field E, therefore the distorted current I2e does not depend upon the direction of the electrical field E, but flows in a constant direction. For example, the distorted current I2e based on the electric field Eb of the crossing region flows in the +b direction, and the distorted current I2e based on the electric field Ea of the gap flows in the +a direction. Note that, the case where α is a positive constant was explained here, but an actual coefficient α depends on the material of the piezoelectric substrate and the crystal orientation and sometimes becomes a negative constant or sometimes shifts in phase.

Here, when paying attention to the distorted currents I2e generated in the crossing region Tc, the distorted currents I2e which flow in the first electrode fingers 33 cancel each other out since the distorted current I2e which flows into the first electrode fingers 33 and the distorted current I2e which flows out of the first electrode fingers 33 are the same in magnitude, but are inverse in direction. In the second electrode fingers 34 as well, in the same way, the distorted currents I2e cancel each other out. Accordingly, the distorted currents I2e in the crossing region Tc of the IDT electrode 55 cancel each other out in the electrode fingers, therefore almost no current is output as the distorted wave to the outside of the SAW element 51.

On the other hand, when paying attention to the distorted currents I2e in the first and second gaps 21 and 22, the distorted current I2e in the first gap 21 and the distorted current I2e in the second gap 22 have the same direction, therefore these distorted currents I2e do not cancel each other out. It is considered that the distorted currents I2e not cancelling each other out, but remaining, become one of the causes of generation of the distorted wave.

Figure 5B:
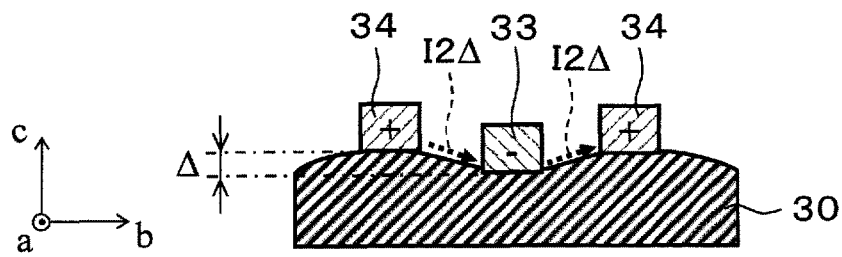
Figure 5C:
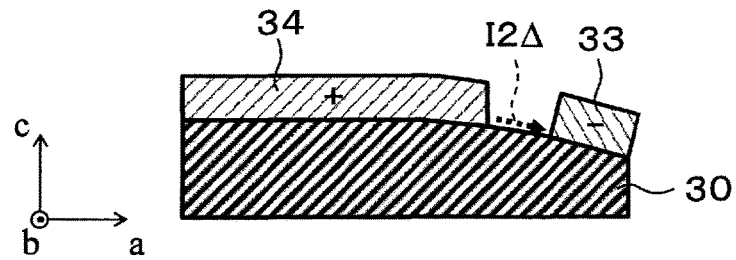

Next, a distorted wave due to mechanical distortion will be explained by using FIG. 5B and FIG. 5C. FIG. 5B is a cross-sectional view taken along a B-B' line in FIG. 5A, and FIG. 5C is a cross-sectional view taken along a C-C' line in FIG. 5A Assume that the second electrode fingers 34 are in a higher potential state than the first electrode fingers 33 for an instant. In FIG. 5B and FIG. 5C, "+" is attached to the second electrode fingers 34 having a higher potential, and "−" is attached to the first electrode fingers 33 having a lower potential. At this time, due to an inverse piezoelectric effect of the piezoelectric substance, as shown in FIG. 5B, the surface of the piezoelectric substrate 30 is deformed and undulation is formed. Though the mode of the undulation depends on the crystal orientation, frequency, etc., for example it is considered that the vicinity of the surface of the piezoelectric substrate 30 is deformed so that the portions of the first electrode fingers 33 having a low potential sink downward and the second electrode fingers 34 having a high potential swell upward. Note that, the form of the undulations shows for convenience the situation of vibration of the SAW. The actual deformation direction depends on the material of crystal, orientation of the crystal, thickness of the electrodes, frequency, and so on. For example, a leaky wave excited on a piezoelectric substrate made of 42° Y-cut LiTaO3 is mainly deformation in the a-direction in the diagram, while a Rayleigh wave is mainly deformation in the c-direction in the diagram. In any case, the following explanation stands in the same way.

When the piezoelectric substrate 30 is deformed in this way, a distorted current due to the nonlinearity of the elastic constant of the piezoelectric substance is generated. In this distorted current, a current I2 due to the second order nonlinearity is proportional to the square of the deformation amount Δ of the piezoelectric substrate 30. When this distorted current is defined as I2Δ, it is considered that the direction of the distorted current I2Δ depends upon the crystal orientation of the piezoelectric substrate 30, therefore it flows in a constant direction not according to the mode of undulation of the piezoelectric substrate 30. For example, the distorted current I2Δ based on the deformation of the crossing region Tc in the piezoelectric substrate 30 flows in the +b direction, and the distorted current I2Δ based on the deformation of the gap region flows in the +a direction.

Further, the distorted currents I2Δ generated in the crossing region Tc cancel each other out since the distorted current I2Δ which flows into the first electrode fingers 33 and the distorted current I2Δ which flows out of the first electrode fingers 33 are equal in magnitude, but are inverse in direction. In the second electrode fingers 34 as well, in the same way, the distorted currents I2Δ which are generated in the crossing region Tc cancel each other out. Accordingly, the distorted currents I2Δ in the crossing region Tc of the IDT electrode 55 cancel each other out and almost no current is output as the distorted wave to the outside of the SAW element 51.

On the other hand, the distorted currents I2Δ generated in the gap region are determined in direction of flow depending upon the crystal orientation and not the direction of the voltage, so flow in the same direction in the first gap 21 and second gap 22. Accordingly, the distorted currents I2Δ generated in the gap region do not cancel each other out. The distorted currents I2Δ which do not cancel each other out, but remain in this way are considered to become one of the causes of generation of a distorted wave.

Note that, as the deformation of the gap region, two types: one induced according to the voltage applied to the gap and one induced due to a spread of deformation of the crossing region Tc up to the gap region may be considered. In the SAW resonators, resonance occurs according to the deformation of the crossing region Tc, therefore the deformation of the crossing region Tc becomes very large near the resonant frequency. For this reason, it is considered that the deformation of the gap region occurring due to the spread of deformation of the crossing region Tc has become the main cause of deformation Further, in the electrode fingers which are positioned at the two ends of the IDT electrodes, cancellation of the distorted currents I2 does not occur, therefore the distorted current I2 which is generated in the crossing region Tc strictly speaking does not become zero. However, in general, the number of electrode fingers in the SAW resonator reaches several tens to several hundreds, therefore the influence of the electrode fingers positioned at the two ends of the IDT electrodes is small.

Note that, FIG. 5 shows an example where the distorted current I2e due to the electrical distortion and the distorted current I2Δ due to the mechanical distortion flow in the same direction in each of the crossing region Tc and gap region. However, the distorted current I2e and the distorted current I2Δ are different in the mechanism of generation, therefore their directions do not always become the same. For example, a case where they flow in inverse directions in each region may also be considered. In this case, mutual cancellation occurs between the distorted current I2e due to the electrical distortion and the distorted current I2Δ due to the mechanical distortion, but the frequency dependencies of the magnitudes of these two currents are very different, therefore it is considered that almost no perfect cancellation occurs between the two currents and a distorted current I2 of the amount of the difference between the two is generated. The distorted currents I2 of the amounts of difference are cancelled out in the crossing region Tc, but remain in the gap region for the same reason as the above-explained reason, therefore a distorted wave is generated after all.

As explained above, it is considered that the distorted current I2e due to the electrical distortion and the distorted current I2Δ due to the mechanical distortion which are generated in the first gap 21 and the second gap 22 become one of factors causing the distorted wave.

Returning to FIG. 3, when considering the distorted currents I2 generated in the first IDT electrode 55 and the second IDT electrode 56, the distorted currents I2 which are generated in the first gap 21 and second gap 22 are output from the first IDT electrode 55, and the distorted currents I2 which are generated in the third gap 23 and the fourth gap 24 are output from the second IDT electrode 56. Note that, the above explanation describes for convenience that plus and minus voltages are applied to the electrodes. However, in an actual filter and duplexer, the voltages which are applied to the electrodes are high frequency AC voltages. In the above description, for making the explanation simpler, a certain moment in the cycle of high frequency is considered. Further, in the above description, a SAW resonator having dummy electrodes was described. However, even in a case where no dummy electrodes are provided, and the electrode fingers directly face the bus bar electrodes, an electric field and vibration the same as those described above are generated between the electrode fingers and the bus bar electrodes, therefore the same principle as that of the present disclosure stands.

Figure 4:
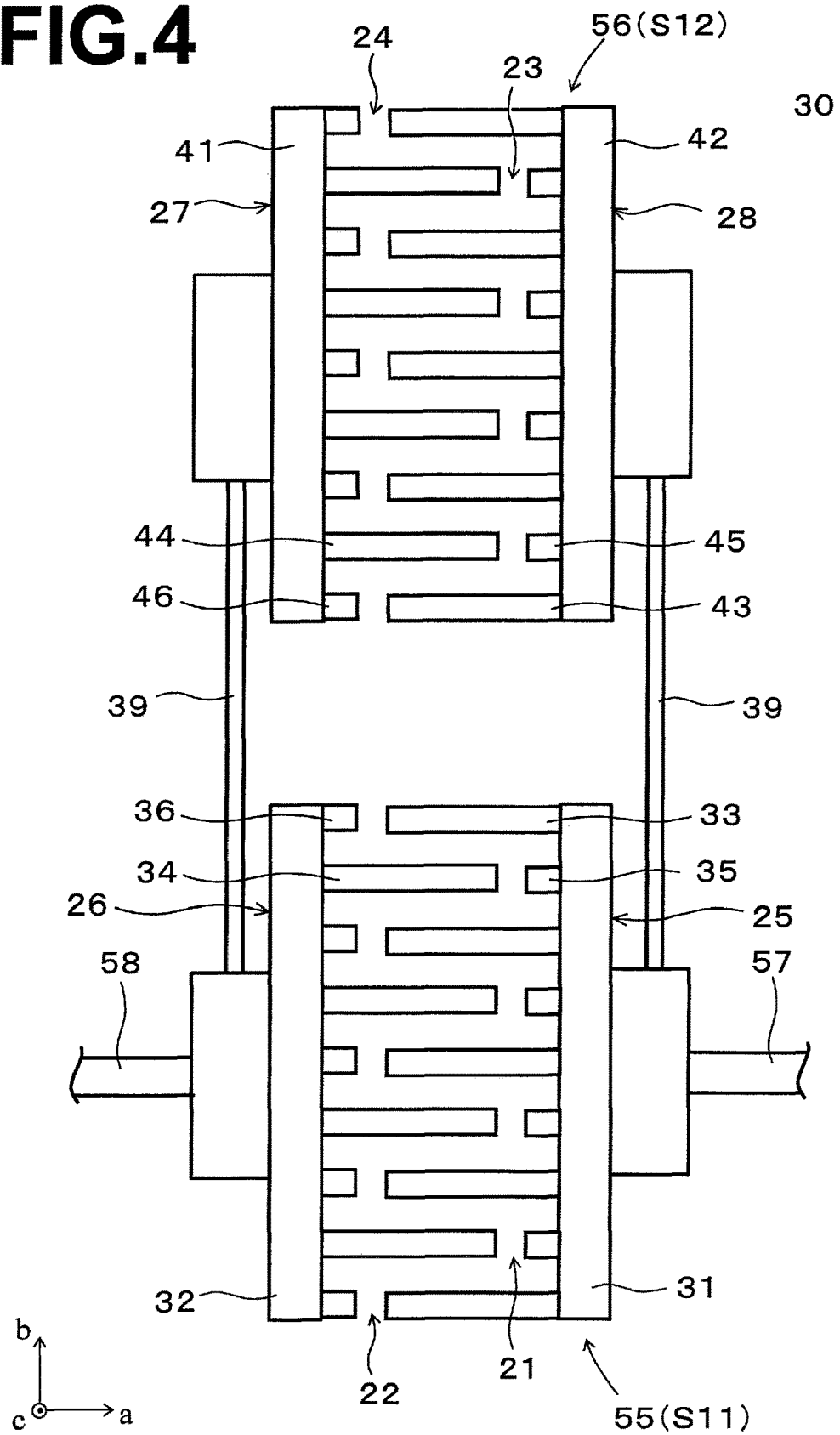
FIG. 4 is an illustration of a plan view which shows a portion of a SAW element of a comparative example.

Here, in the SAW element 51, the distorted wave ends up being reduced because the first bus bar electrode 31 of the first IDT electrode 55 and the third bus bar electrode 41 of the second IDT electrode 56 are electrically connected and the second bus bar electrode 32 of the first IDT electrode 55 and the fourth bus bar electrode 42 of the second IDT electrode 56 are electrically connected. The reason for the reduction of the distorted wave in the SAW element 51 will be explained compared with the SAW element 52 in the comparative example shown in FIG. 4.

The SAW element 52 in the comparative example differs from the SAW element 51 in the present embodiment only in the connection configuration of the bus bar electrodes, but the rest of the configurations are the same. Specifically, the SAW element 51 in the present embodiment shows the criss-crossed relationship when the bus bar electrodes which configure the first IDT electrode 55 and second IDT electrode 56 and have the same polarity are connected to each other. In contrast, in the SAW element 51 in the comparative example, the bus bar electrodes which are arranged on the same side in the first IDT electrode 55 and the second IDT electrode 56 are connected to each other. That is, in the SAW element 52 in the comparative example, the first bus bar electrode 31 of the first IDT electrode 55 is electrically connected with the fourth bus bar electrode 42 of the second IDT electrode 56, and the second bus bar electrode 32 of the first IDT electrode 55 is electrically connected with the third bus bar electrode 41 of the second IDT electrode 56.

When considering the distorted currents I2 which are generated in the SAW element 52 in the comparative example, due to the electrical distortion and mechanical distortion of the piezoelectric substrate 30 as explained above, the distorted current I2 is generated in each of the first IDT electrode 55 and the second IDT electrode 56. The distorted current I2 which is output from the first IDT electrode 55 and the distorted current I2 which is output from the second IDT electrode 56 flow in the same direction, therefore they do not cancel each other out, but are output to the outside.

On the other hand, according to the SAW element 51 in the present embodiment, the distorted current I2 is generated in each of the first IDT electrode 55 and the second IDT electrode 56, and the distorted current I2 which is output from the first IDT electrode 55 and the distorted current I2 which is output from the second IDT electrode 56 flow in inverse directions, therefore they cancel each other out. For this reason, the distorted currents I2 output from the first IDT electrode 55 and the second IDT electrode 56 as a whole becomes small.

Accordingly, according to the SAW element 51, the distorted current I2 can be reduced. In particular, in the SAW element 51, the second IDT electrode 56 is formed with the same shape and same size as those of the first IDT electrode 55, therefore the distorted current I2 output from the second IDT electrode 56 and the distorted current I2 output from the first IDT electrode 55 become substantially equal in magnitude. Accordingly, the effect of cancellation of the distorted currents I2 becomes large, therefore the distorted currents I2 output from the entire SAW element 51 (S1) can be greatly suppressed.

Note, the distorted current I2 relating to the second-order nonlinearity which is output from the SAW element 51 is considered to be mainly caused by the distorted current I2 generated in the gap region as explained before. Therefore, if the number of gaps, gap length "d", and gap width "w" are the same between the first IDT electrode 55 and the second IDT electrode 56, substantially the same distorted currents I2 are generated in the two IDT electrodes. For this reason, in the case where the number of gaps, gap length "d", and gap width "w" are the same between the first IDT electrode 55 and the second IDT electrode 56, even when the widths of the crossing regions Tc of the two IDT electrodes are different, a high effect of reduction of a distorted wave is obtained. Here, the direction of arrangement from the first comb-shaped electrode 25 toward the second comb-shaped electrode 26 is defined as D1, and the direction of arrangement from the third comb-shaped electrode 27 toward the fourth comb-shaped electrode 28 is defined as D2. D1 is equal to the direction in which the front ends of the first electrode fingers 33 face the front ends of the second dummy electrode fingers 36 through the second gaps 22. D2 is equal to the direction in which the front ends of the third electrode fingers 43 face the front ends of the fourth dummy electrode fingers 46 through the fourth gaps 24.

Figure 24A:
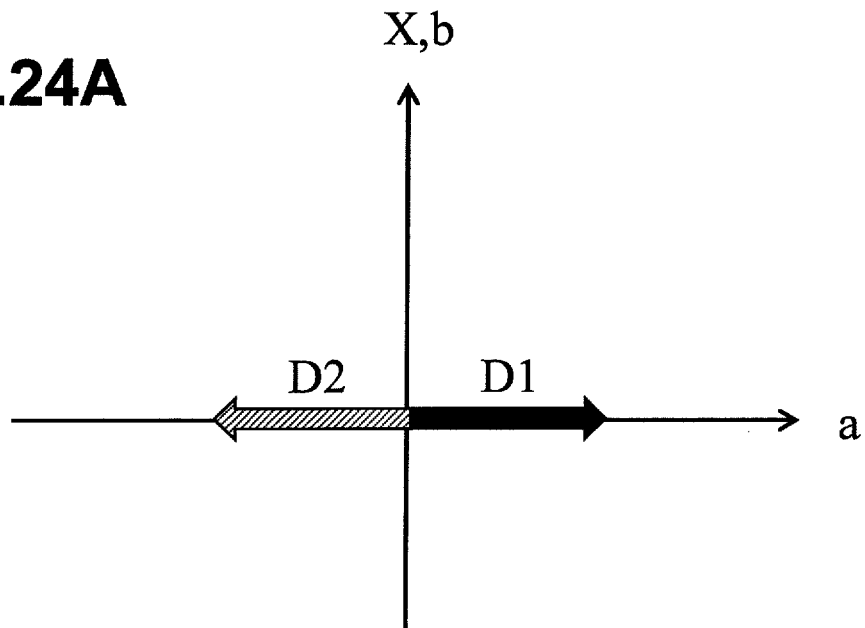
FIGS. 24A to 24C are illustrations of schematic views for explaining a direction of arrangement of electrodes for realizing a distortion reduction effect.
Figure 24B:
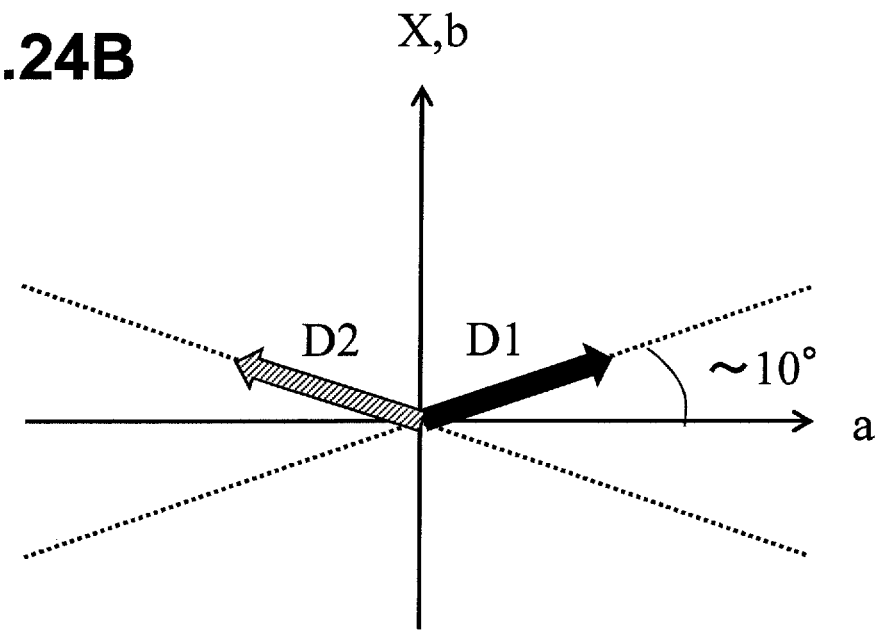
Figure 24C:
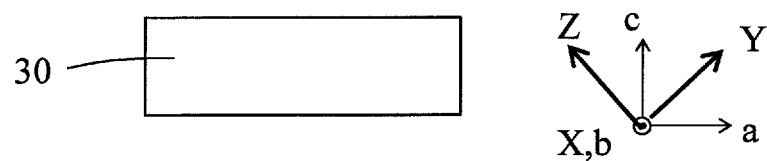

Making D1 and D2 different means that D1 and D2 are given components having different polarities with respect to the crystal orientation of the piezoelectric substrate 30 as shown in FIGS. 24A and 24B. The crystal axes of the piezoelectric substrate 30 are X-, Y-, and Z-axes which are perpendicular to each other, and the X-axis and the b-axis are made the same. Further, D1 and D2 are given components having positive and negative polarities which are inverse to each other when using the X-axis as the standard. That is, between D1 and D2, one contains the positive component of the a-direction, and the other contains the negative component of the a-direction.

In the present embodiments, as shown in FIG. 24A, D1 is comprised of the positive component along the a-direction, while D2 is comprised of the negative component along the a-direction. For this reason, D1 and D2 cancel each other out. In this way, the distorted waves are most effectively cancelled out by each other in the case where D1 and D2 are different in direction by 180° from each other. However, as shown in FIG. 24B, each of D1 and D2 may be inclined by about 10° with respect to the a-direction as well. Note that, in theory, for example, there also exists an effect even in a case where D1 and D2 are inclined by +10° and −10° with respect to the X-axis (b-direction). However, when considering the propagation efficiency etc. of a SAW, realistically, the angle formed by D1 and D2 is about ±180°±10°. By configuring the system in this way, the D1 and D2 are reliably given components of positive and negative polarities which are inverse to each other.

Such a SAW device 51 is preferably used as the resonator of a portion in which a large distortion occurs in the branching filter 1.

As explained before, inter-modulation distortion IMD is the distorted wave which is generated by mixing of an out-of-band interfering wave which is out of the transmission band and reception band and the transmission wave. IMD may be generated in any place where there are both of an interfering wave input from the antenna and a transmission wave input from the transmission side. However, particularly a spot at which the two waves are strong and the distorted wave in the reception band generated is not attenuated before reaching the reception filter becomes the maximum source of generation. For this reason, in the branching filter 1 having the configuration in FIG. 2, there is possibility that the resonators S11 and S12 and the resonator S15 will become the maximum sources of generation. Further, there is tendency for the vibration to become large near the range from the resonant frequency to the antiresonant frequency of the resonator. The distorted wave generated accompanied with the vibration becomes large as well. For this reason, a large distortion tends to occur in the resonator in which the frequencies of the interfering wave and the transmission wave are near the range from the resonant frequency to the antiresonant frequency Accordingly, in the duplexer 1, the intensity of the transmission signal TS is higher than the intensity of the reception signal RS. Therefore, by arranging the SAW element 51 of the transmission filter 5, the distorted signal can be efficiently reduced. In the transmission filter 5, for the serial resonator S1 nearest the antenna 109, the transmission signal TS and reception signal RS are filtered, therefore the distorted signal is apt to become large. Accordingly, by employing the structure shown in FIG. 3 for the serial resonator S1 nearest the antenna 109, the distorted wave can be more efficiently reduced.

Note that, the serial resonators S2 and S3 other than the serial resonator S1 and the parallel resonators P1, P2, and P3 for example have the same configuration as that of the first IDT electrode 55 configuring the SAW resonator S11. Further, the auxiliary resonator 15 in the reception filter 9 for example has the same configuration as that of the first IDT electrode 55 configuring the SAW resonator S11.

FIG. 6 is a circuit diagram which shows the configuration of a duplexer 2 according to a second embodiment of the disclosure. The duplexer 2 is configured by a transmission filter 5 and reception filter 9. The transmission filter 5 has the piezoelectric substrate 30, serial resonators S101, S2, and S3, and parallel resonators P1, P2, and P3 which are formed on the piezoelectric substrate. They configure a ladder type filter circuit.

The duplexer 2 according to the second embodiment differs from the duplexer 1 according to the first embodiment only in the configuration of the serial resonator which is arranged nearest the antenna terminal 7. The configurations other than that are the same as those of the duplexer 1.

Specifically, in contrast to the duplexer 1 according to the first embodiment in which the serial resonator S1 was configured by the SAW resonator S11 and the SAW resonator S12 connected in parallel to the SAW resonator S11, in the duplexer 2 according to the second embodiment, the serial resonator S101 is configured by the SAW resonator S11 and the SAW resonator S12 connected in series to the SAW resonator S11.

Figure 7:
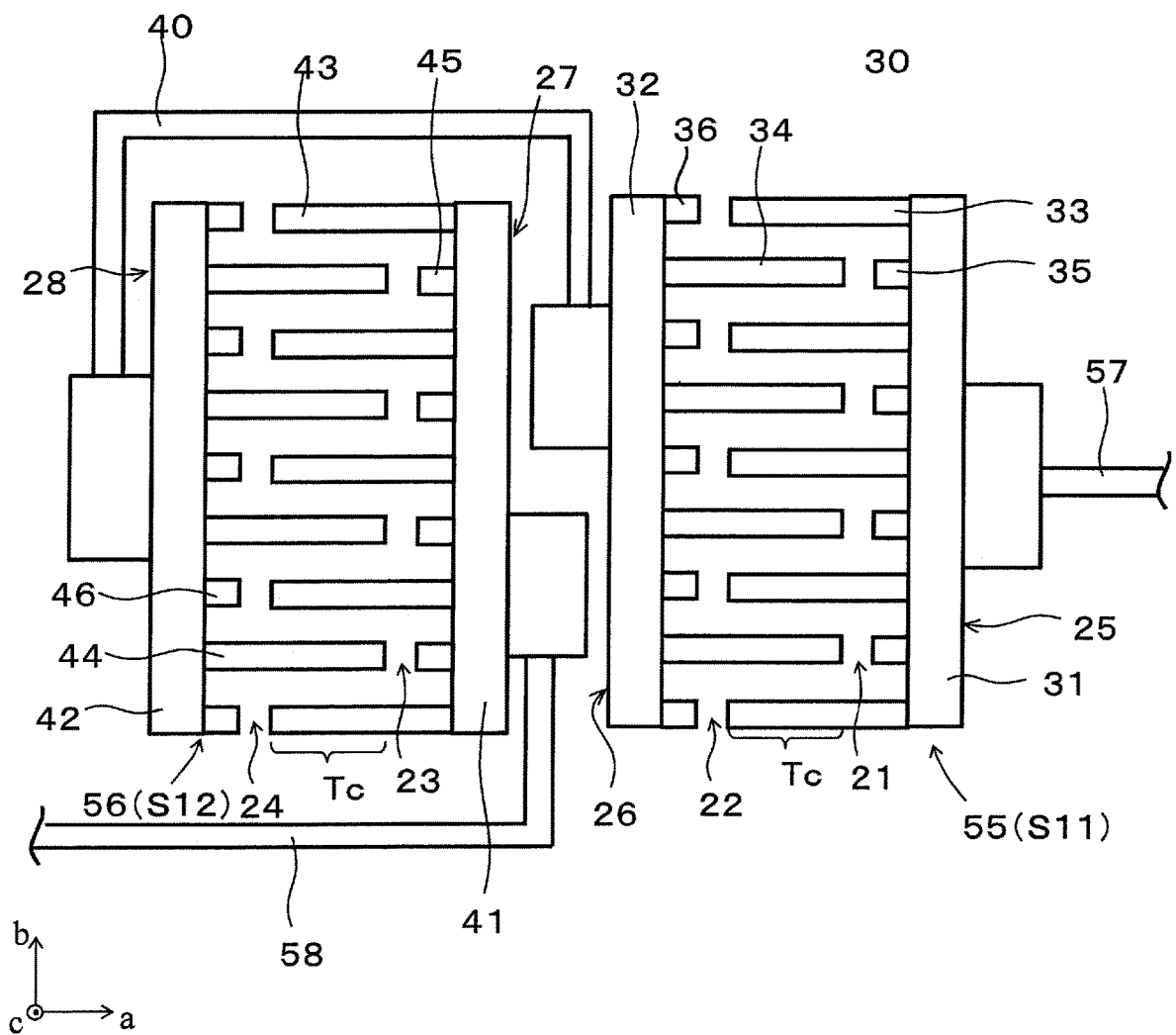
FIG. 7 is an illustration of a plan view which shows a SAW element according to the second embodiment of the disclosure.

FIG. 7 is a plan view which shows a portion of a SAW element 53 according to the second embodiment of the disclosure and shows only the part of the serial resonator S101. Further, in FIG. 7, substantially the entire surface on the drawing sheet is defined as the main surface of the piezoelectric substrate 30, the periphery of the piezoelectric substrate 30 is not shown.

The second IDT electrode 56 is connected in series with respect to the first IDT electrode 55, but the serial resonator S101 reduces the distorted wave which is generated in the serial resonator S101 by setting the connection between the first IDT electrode 55 and the second IDT electrode 56 to a mode which is different from the normal one.

First, the signal input line 57 is connected to the first bus bar electrode 31 which is arranged on the outer side between the two bus bar electrodes in the first IDT electrode 55. On the other hand, the signal output line 58 is connected to the fourth bus bar electrode 42 which is arranged on the inner side between the two bus bar electrodes in the second IDT electrode 56.

Further, the second bus bar electrode 32 which is arranged on the inner side between the two bus bar electrodes in the first IDT electrode 55 is electrically connected to the fourth bus bar electrode 42 which is arranged on the outer side between the two bus bar electrodes in the second IDT electrode 56. Due to this, the first IDT electrode 55 and the second IDT electrode 56 are connected in series. The connection between the second bus bar electrode 32 and the fourth bus bar electrode 42 is carried out through an interconnect line 40.

At this time, both of the direction of the front end of a first electrode finger 33 facing the front end of a second dummy electrode finger 36 through the second gap 22 and the direction of the front end of a third electrode finger 43 facing the front end of a fourth dummy electrode finger 46 through the fourth gap 24 are the −a direction (leftward direction on the drawing sheet) and are the same. In the same way, both of the direction of the front end of a first dummy electrode finger 35 facing the front end of a second electrode finger 34 through the first gap 21 and the direction of the front end of a third dummy electrode finger 45 facing the front end of a fourth electrode finger 44 through the third gap 23 are the a direction (leftward direction on the drawing sheet) and are the same.

Note, the forth bus bar electrode 42 in FIG. 7 is equivalent to the third bus bar electrode 41 in FIG. 3, the third bus bar electrode 41 in FIG. 7 is equivalent to the forth bus bar electrode 42 in FIG. 3. In the same way, the third dummy electrode finger 45, the fourth electrode finger 44, the third electrode finger 43, and the fourth dummy electrode finger 46 in FIG. 7 are equivalent to the fourth dummy electrode finger 46, the third electrode finger 43, the fourth electrode finger 44, and the third dummy electrode finger 45 in FIG. 3.

In the SAW element 53 as well, as explained in the first embodiment, the distorted current I2 is generated in each IDT electrode.

Here, in the SAW element 53, the distorted wave is reduced by the first bus bar electrode 31 being electrically connected to the signal input line 57, by the second bus bar electrode 32 and the fourth bus bar electrode 42 being electrically connected, and by the third bus bar electrode 41 being electrically connected with the signal output line 58. The reason for reduction of the distorted wave in the SAW element 53 will be explained in comparison with the SAW element 54 in the comparative example shown in FIG. 8.

The SAW element 54 in the comparative example differs from the SAW element 53 in the present embodiment only in the connection configuration of the bus bar electrodes and connection configuration of the signal output line 58. The configurations other than those are the same. In contrast to the SAW element 53 in the present embodiment in which the second bus bar electrode 32 in the second IDT electrode 56 and the fourth bus bar electrode 42 in the second IDT electrode 56 are electrically connected as explained above, in the SAW element 54 in the comparative example, the second bus bar electrode 32 in the first IDT electrode 55 and the third bus bar electrode 41 in the second IDT electrode 56 are electrically connected. Further, in the SAW element 53, the signal output line 58 is connected to the fourth bus bar electrode 42 in the second IDT electrode 56.

When considering the distorted currents I2 generated in the SAW element 54 in the comparative example, as explained above, due to electrical distortion and mechanical distortion of the piezoelectric substrate 30, a distorted current I2 is generated in each of the first IDT electrode 55 and the second IDT electrode 56. In the SAW element 53, the distorted current I2 output from the first IDT electrode 55 and the distorted current I2 output from the second IDT electrode flow in the same direction, therefore they do not cancel each other out and are output to the outside.

On the other hand, according to the SAW element 53 in the present embodiment, a distorted current I2 is generated in each of the first IDT electrode 55 and the second IDT electrode 56, but the distorted current I2 output from the first IDT electrode 55 and the distorted current I2 output from the second IDT electrode 56 flow in inverse directions, therefore cancel each other out. For this reason, the distorted current I2 output from the first IDT electrode 55 and second IDT electrode 56 as a whole becomes small Accordingly, according to the SAW element 53, the distorted current I2 can be reduced. In the same way as the SAW element 51 according to the first embodiment, if the second IDT electrode 56 is formed with the same shape and same size as those of the first IDT electrode 55, the distorted current I2 output from the first IDT electrode 55 and second IDT electrode 56 as a whole can be greatly suppressed.

EXAMPLES

Example 1

Two types of resonators A1 and A2 in Example 1, which have the same configuration as that of the serial resonator S1 (FIG. 3) of the SAW element 51 according to the first embodiment described above, and a reference resonator R1 were prepared. These resonators were measured for one type of distorted wave, that is, the secondary higher harmonic H2.

The reference resonator R1 is configured by one SAW resonator, while each of the resonators A1 and A2 in Example 1 is formed so that the reference resonator R1 is divided into two resonators which are connected in parallel to each other as shown in FIG.

Specifically, the resonators A1, A2, and R1 were prepared according to the conditions shown in Table 1.

TABLE 1

| | A1 | A2 | R1 |
|---|---|---|---|
| Material of piezoelectric substrate | LiTaO3 | | |
| Cut angle of piezoelectric substrate | | | |
| 42° Y-cut X-propagated | | | |
| Material of IDT electrodes | AlCu alloy | | |
| Electrode finger pitch "p" | 2 3 µm | | |
| Gap length "d" | 0 75 µm | | |
| Gap width "w" | 1 15 µm | | |
| Crossing width | 9λ | 18λ | 18λ |
| Number of electrode fingers | 160/160 | 80/80 | 160 |

In Table 1, the numbers "160/160" of the electrode fingers of the resonator A1 are respectively the numbers of electrode fingers of the two SAW resonators S11 and S12 which are connected in parallel. That is, in the resonator A1, both of the numbers of electrode fingers of the SAW resonator S11 and SAW resonator S12 are 160, and the two resonators are the same in size. The numbers "80/80" of electrode fingers of the resonator A2 mean the same, and the two SAW resonators S11 and S12 are given the same size also in the resonator A2.

The "crossing width" in Table 1 is the length of the crossing region Tc, "λ" is the wavelength of SAW at the resonant frequency, and λ=2p.

The resonators A1 and A2 in Example 1 are different in the crossing widths of the SAW resonators S11 and S12 or numbers of their electrode fingers from that of the reference resonator R1. However, the sum of the product of the crossing width and the number of electrode fingers in the SAW resonator S11 and the product of the crossing width and the number of electrode fingers in the SAW resonator S12 is made equal to the product of the crossing width and the number of electrode fingers in the reference resonator R1. That is, the capacities of resonators are made equal among the resonators A1, A2, and R1.

Figure 9:
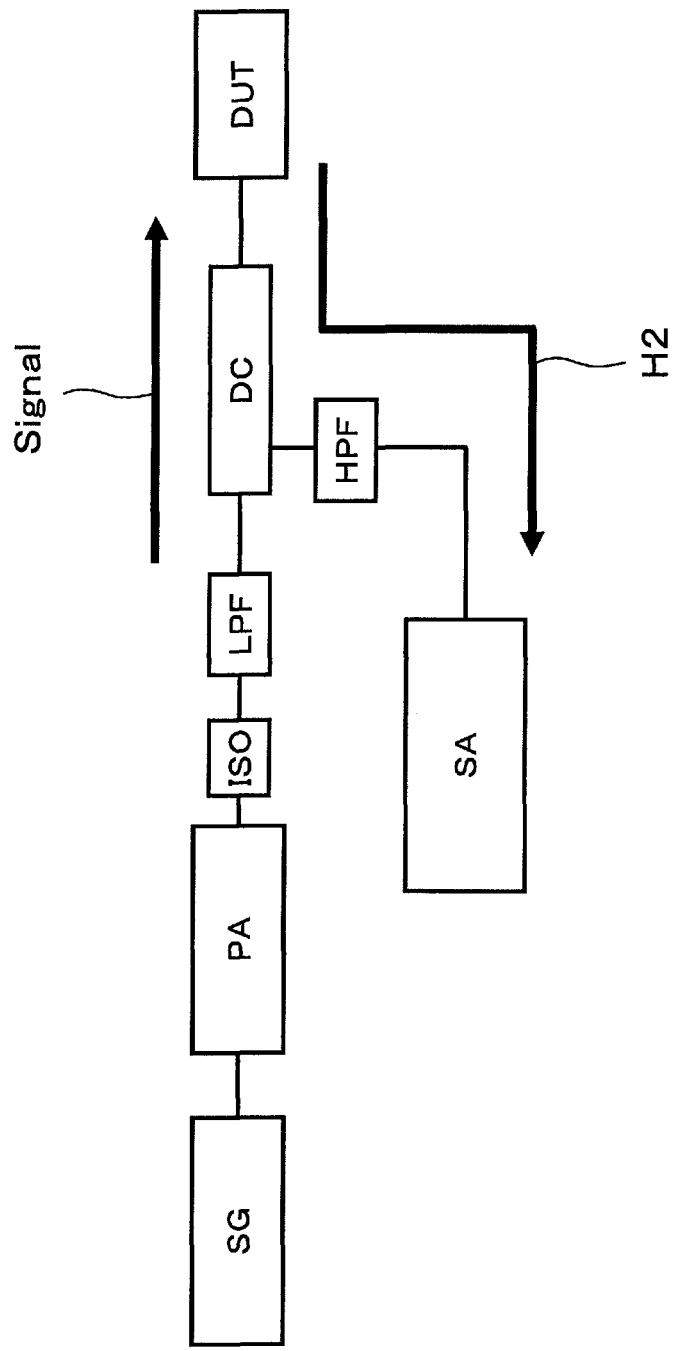
FIG. 9 is an illustration of a block diagram which shows a system for measurement of the effect of reduction of distortion.

The secondary higher harmonic H2 was measured using the measurement system shown in FIG. 9. In FIG. 9, SG is a signal generator, PA is a power amplifier, ISO is an isolator, LPF is a low pass filter, DC is a directional coupler, DUT is a SAW resonator under test, HPF is a high pass filter, and SA is a spectrum analyzer. The resonators A1, A2, and R1 are arranged at the position of the resonator DUT.

That is, in the measurement system shown in FIG. 9, a signal having a predetermined power is generated at the signal generator SG, that signal is input through the power amplifier PA etc. to the resonator DUT, and the secondary higher harmonic H2 contained in the reflected wave from the resonator DUT is measured at the spectrum analyzer SA. The LPF is inserted in order to reduce the unwanted secondary higher harmonic output from the PA. Further, the HPF is inserted in order to prevent the input signal reflected from the DUT from being input to the SA. The power of the input signal is 22 dBm, and the frequency is 750 to 950 MHz. Accordingly, the frequency of the secondary higher harmonic becomes 1500 to 1900 MHz. In the following Examples 2 and 3 as well, the conditions concerning the measurement system are the same as those in Example 1.

Figure 10:
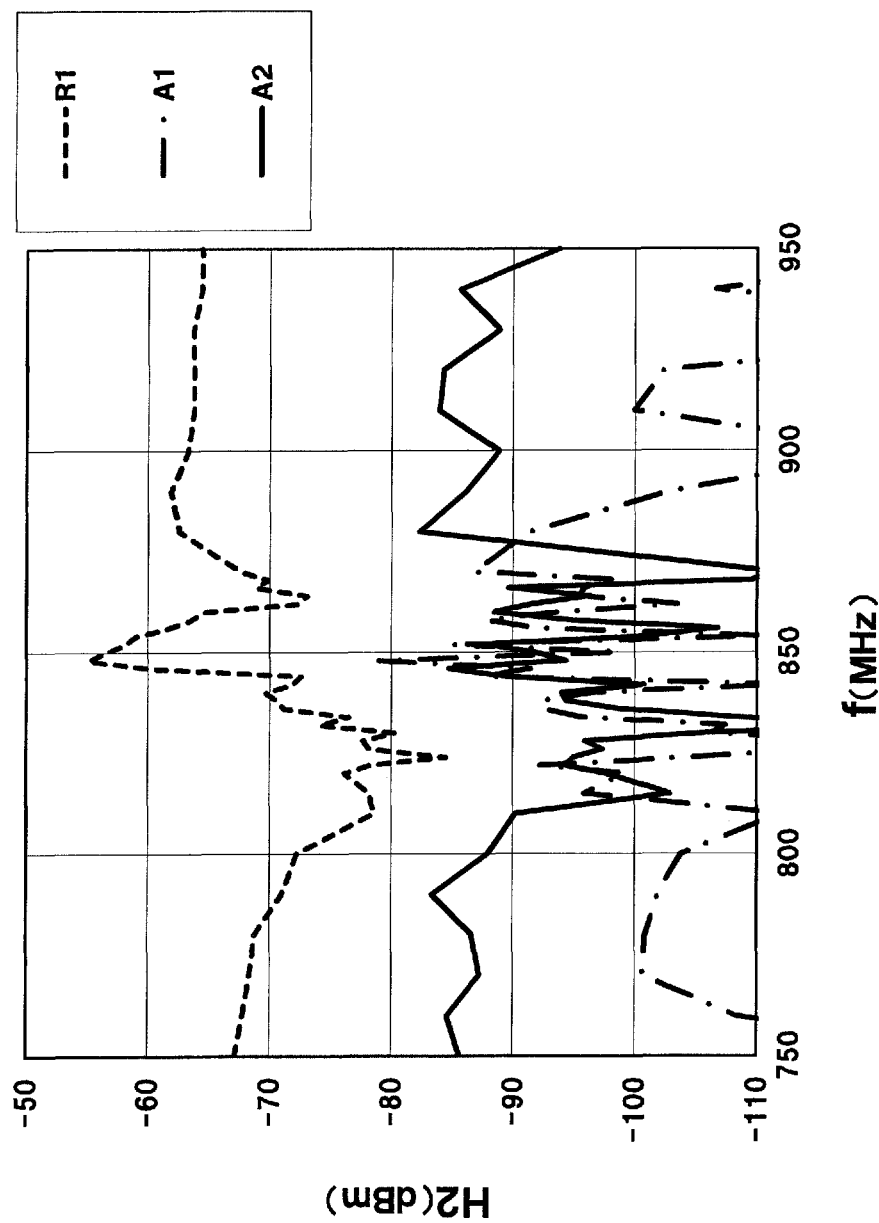
FIG. 10 is an illustration of a graph which shows the results of measurement of the effect of reduction of distortion.

FIG. 10 shows the measurement results of the secondary higher harmonic H2 in Example 1. In the graph in FIG. 10, a broken line indicates the measurement result of the reference resonator R1, a one-dot chain line indicates the measurement results of the resonator A1 in Example 1, and a solid line indicates the measurement result of the resonator A2 in Example 1. An abscissa indicates the frequency of the input signal, and an ordinate indicates the output value of the secondary higher harmonic H2.

As apparent from the measurement results shown in FIG. 10, the resonators A1 and A2 in Example 1 are reduced in the secondary higher harmonic H2 more than the reference resonator R1. That is, it could be confirmed that the distorted wave could be reduced by the resonators A1 and A2 in Example 1.

Note that, the resonant frequencies of the SAW resonators used are about 850 MHz. In the measurement result of the reference resonator R1 shown in FIG. 10, the peak existing near 850 MHz is obtained due to the contribution of the distorted current I2 Δ, almost constant values at the low frequency and high frequency sides are obtained due to the contribution of the distorted current I2e. That is, the frequency dependency of the secondary higher harmonic H2 of the reference resonator R1 is a composition of the contribution of the distorted current I2Δ having a peak in the vicinity of the resonant frequency and the contribution of the distorted current I2e having an almost constant value (about −75 dBm) at all frequencies. The distorted current I2Δ and the distorted current I2e become inverse polarities. Therefore, in the vicinity of the frequencies 820 MHz and 865 MHz, the distorted current I2Δ and the distorted current I2e cancel each other out, therefore the intensity of the secondary higher harmonic H2 becomes small. This phenomenon is caused due to the characteristics of the piezoelectric substrate used. In a case where use is made of a piezoelectric substrate made of a different material or having a different cut angle, the distorted current I2Δ and distorted current I2e sometimes have the same polarity or are deviated in phase. Even in such a case, the distorted current is reduced according to the configuration of the present embodiment. In the resonators A1 and A2 in Example 1, both of the contributions of the distorted current I2Δ and the distorted current I2e are reduced over the entire frequency region. This is true also in Examples 2 and 3 which will be shown below.

Example 2

Four types of resonators B1, B2, B3, and B4 having the same configuration as that of the serial resonator S1 (FIG. 3) of the SAW element 51 according to the first embodiment described above were prepared. These were measured for the secondary higher harmonic (H2).

The resonators B1, B2, B3, and B4 in Example 2 were prepared by setting the conditions other than the crossing widths and numbers of electrode fingers so as to become the same conditions as those shown in Table 1. The crossing widths were all set at 18λ. Further, the numbers of electrode fingers were made "80/80" for the resonator B1, "96/64" for the resonator B2, "112/48" for the resonator B3, and "128/32" for the resonator B4.

That is, in Example 2, the two SAW resonators S11 and S12 in the resonator B1 have the same size, but the sizes of the two SAW resonators S11 and S12 are different in the other resonators B2, B3, and B3. Note that, the resonator B1 is the same as the resonator A2 in Example 1.

Figure 11:
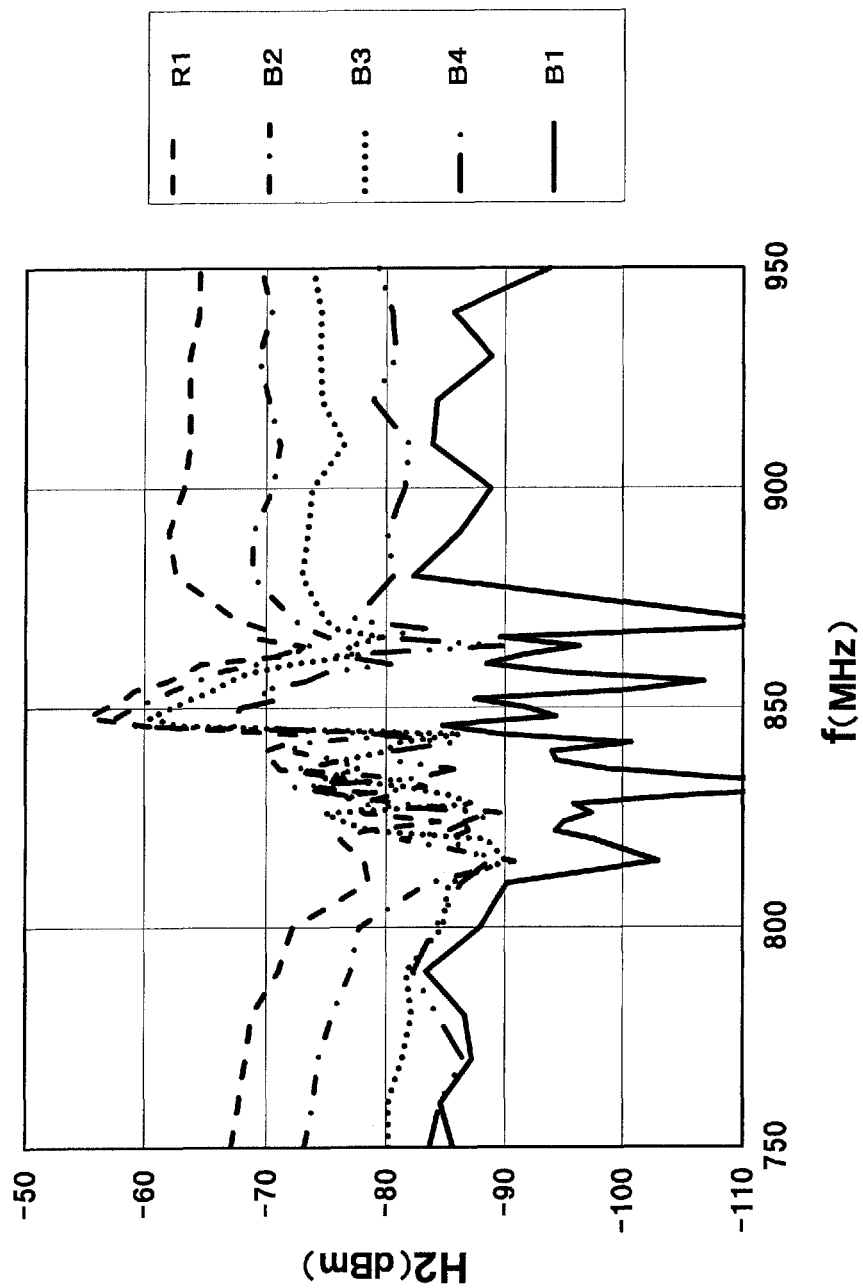
FIG. 11 is an illustration of a graph which shows the results of measurement of the effect of reduction of distortion.

FIG. 11 shows the measurement results of the secondary higher harmonic H2 in Example 2. In the graph in FIG. 11, the solid line indicates the measurement result of the resonator B1, a two-dot chain line indicates the measurement result of the resonator B2, a dotted line indicates the measurement result of the resonator B3, and the one-dot chain line indicates the measurement result of the resonator B4. Further, the measurement result of the reference resonator R1 shown in Example 1 is indicated by the broken line in the same graph.

As apparent from the measurement results shown in FIG. 11, it is seen that the secondary higher harmonic H2 is reduced in all resonators in Example 2 more than the reference resonator R1. Further, it is seen that the secondary higher harmonic H2 is reduced more as the two SAW resonators S11 and S12 configuring the resonator in Example 2 approach the same size. It could be confirmed from this result that the secondary higher harmonic H2 could be reduced more if the two SAW resonators S11 and S12 configuring the resonator were given the same size.

Example 3

Figure 8:
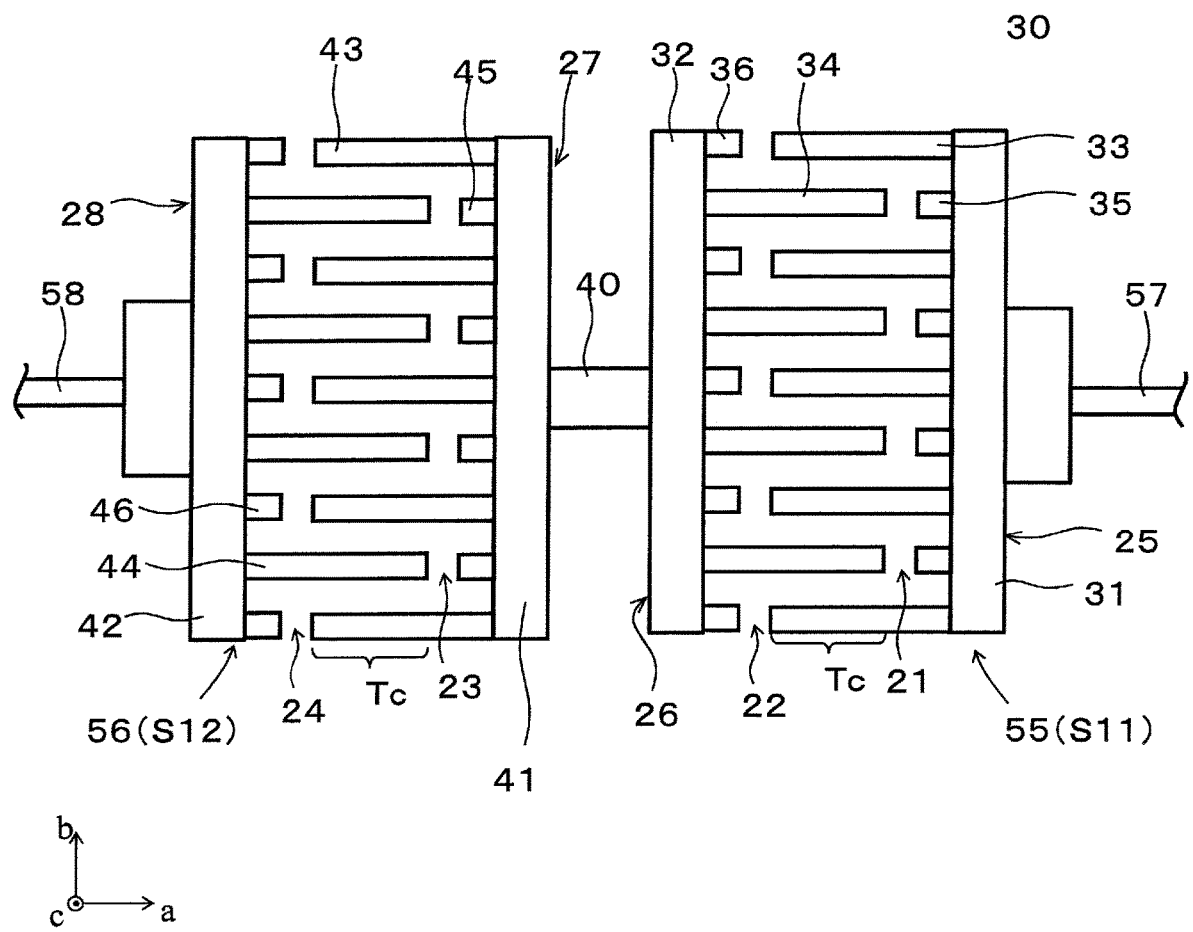
FIG. 8 is an illustration of a plan view which shows a portion of a SAW element of a comparative example.

A resonator C1 having the same configuration as that for the serial resonator S101 (FIG. 7) of the SAW element 53 according to the second embodiment described above, a resonator Co of a comparative example which had the same configuration as that of the serial resonator S101 of the SAW element 54 for comparison shown in FIG. 8 and a reference resonator R2 were prepared. These resonators were measured for the secondary higher harmonic H2.

The resonator C1 in Example 3, the resonator Co of the comparative example, and the reference resonator R2 were prepared by setting the conditions other than the crossing width and number of electrode fingers so as to become the same conditions as those shown in Table 1. The crossing width is 26λ for both of the two SAW resonators S11 and S12 in the resonator C1, is 13λ for both of the two SAW resonators S11 and S12 in the resonator Co, and is 13λ for the resonator R2. Further, the number of electrode fingers is "100/100" for the resonator C1, "200/200" for the resonator Co, and 100 for the resonator R2.

Figure 12:
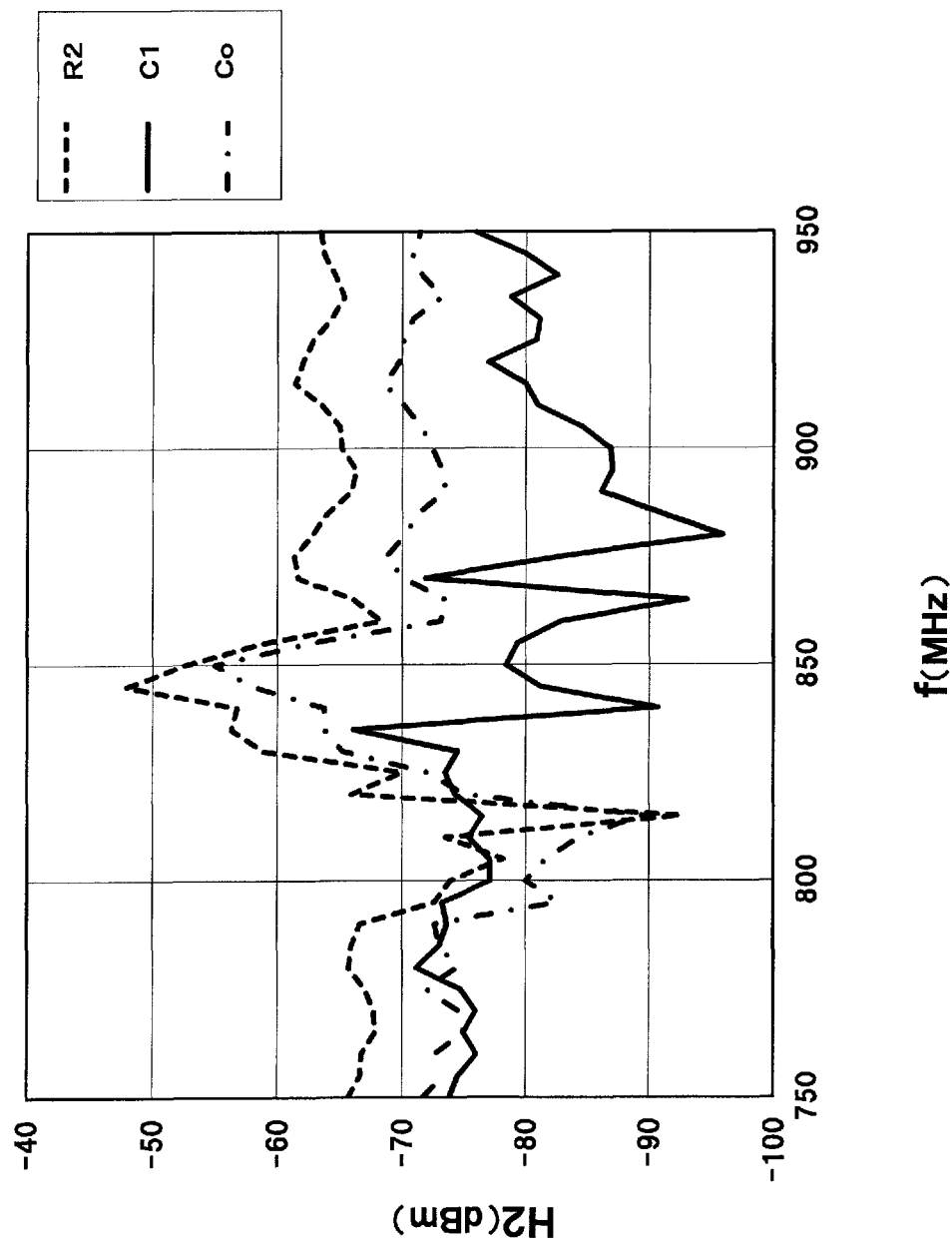
FIG. 12 is an illustration of a graph which shows the results of measurement of the effect of reduction of distortion.

FIG. 12 shows the measurement results of the secondary higher harmonic H2 in Example 3. In the graph in FIG. 12, the solid line indicates the measurement result of the resonator C1 in Example 3, the one-dot chain line indicates the measurement result of the resonator Co, and the broken line indicates the measurement result of the reference resonator R2.

As shown in the measurement results in FIG. 12, it is seen that the secondary higher harmonic H2 is reduced more than the reference resonator R2 in both of the resonators of the resonator C1 in Example 3 and resonator Co in the comparative example. The reason for the reduction of the secondary higher harmonic H2 of the resonator Co in the comparative example is considered to be that the voltage applied to the resonator Co is divided for the two SAW resonators S11 and S12. However, the resonator C1 in Example 3 is reduced in the secondary higher harmonic H2 more than the resonator Co in the comparative example. It could be confirmed from this result that the resonator C1 in Example 3 had a larger effect of reduction of the secondary higher harmonic H2 than the resonator Co in the comparative example.

Note that, only the effect of reduction of the secondary higher harmonic H2 was shown in the examples explained above, but the resonators according to examples exert an effect of reduction by the same principle also for other distorted waves caused by second order nonlinearity, for example, the second order inter-modulation distortion (IMD2) and the like or fourth order, sixth order, or other even number order nonlinearity.

The present disclosure is not limited to the above embodiments and may be executed in various aspects.

In the embodiments explained above, the example where the first IDT electrode 55 and the second IDT electrode 56 were formed with the same shapes and same sizes was explained, but the shapes and sizes of the two IDT electrodes may be different as well. As shown in Example 2 as well, the numbers of electrode fingers, crossing widths, etc. may be made different between the first IDT electrode 55 and the second IDT electrode 56. Even in such a case, the distorted current I2 generated from the first IDT electrode 55 and the distorted current I2 generated from the second IDT electrode 56 flow in directions cancelling each other out, therefore an effect of reduction of the distorted wave is exerted.

Figure 13A:
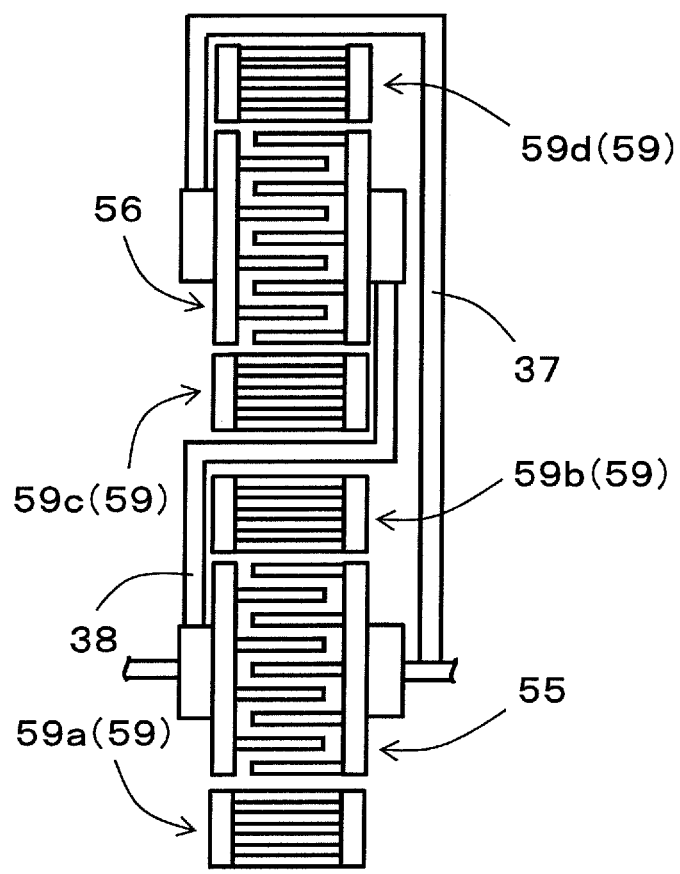
Figure 13B:
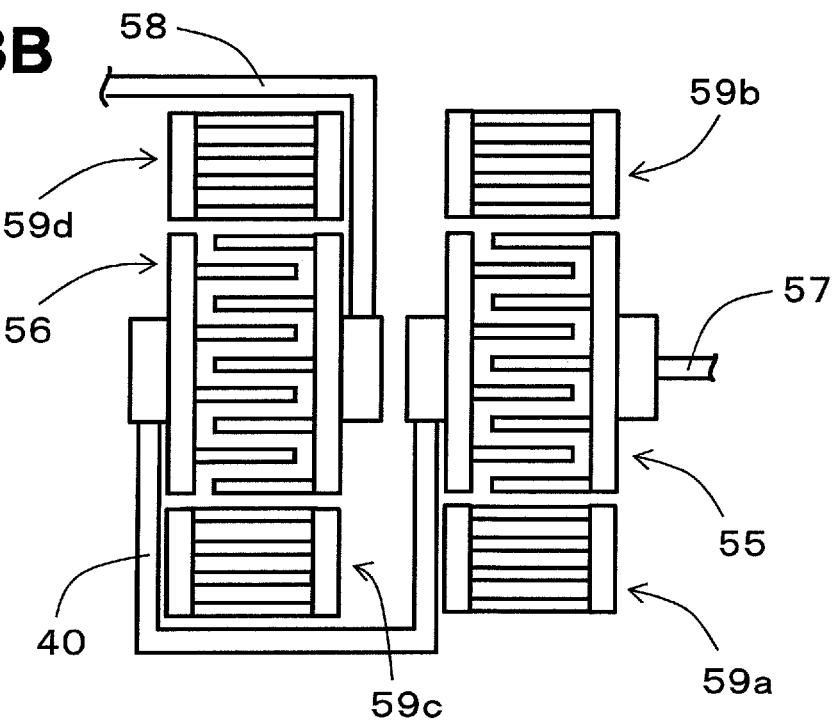
Figure 14A:
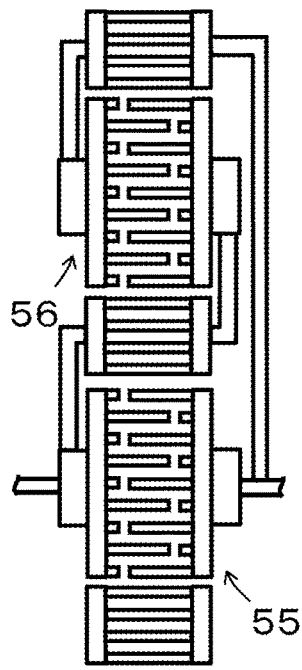
FIGS. 14A to 14D are illustrations of plan views which shows variations in a method of connection of a SAW element according to an embodiment of the disclosure.
Figure 14B:
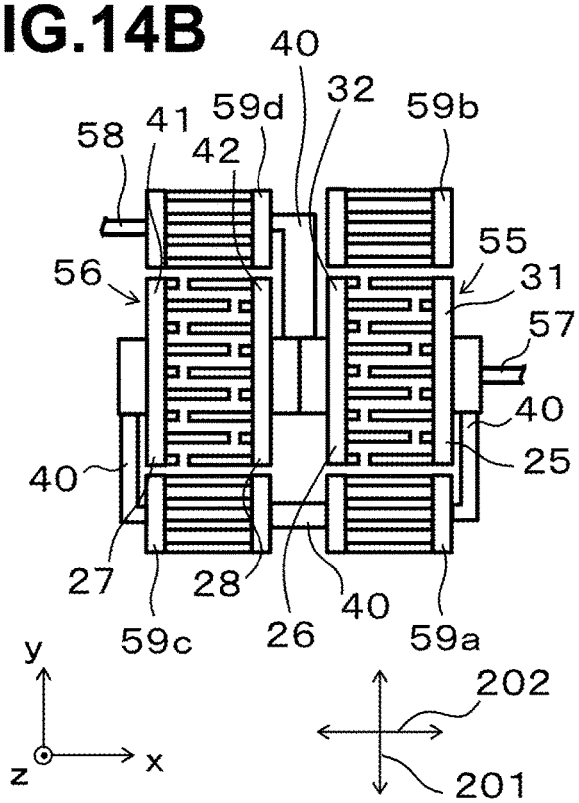
Figure 14C:
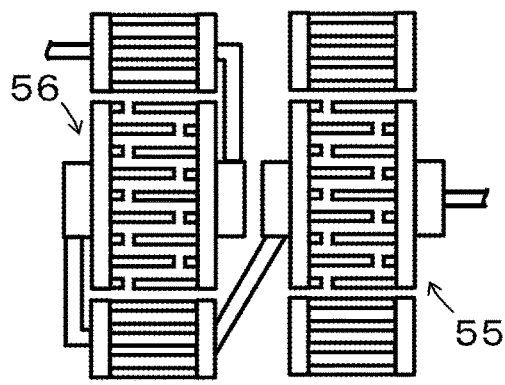
Figure 14D:
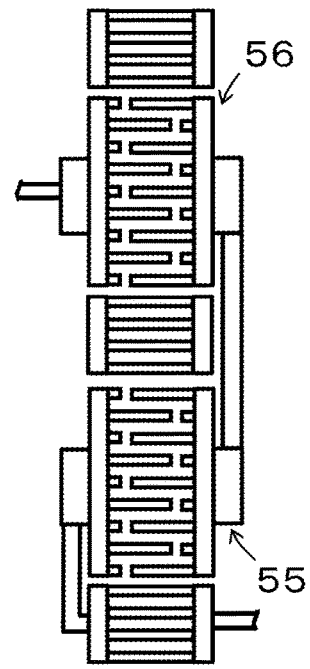

Further, as shown in FIG. 13, each of the first IDT electrode 55 and the second IDT electrode 56 may have a reflector electrode 59 between itself and the first interconnect line 37 or second interconnect line 38 as well. More specifically, in order to reflect the acoustic wave which is propagated in a direction vertical to the direction of arrangement of the first comb-shaped electrode 25 and the second comb-shaped electrode 26, the first IDT electrode 55 has reflector electrodes 59a and 59b so as to sandwich the first IDT electrode 55 in the propagation direction.

Further, the second IDT electrode 56 has reflector electrodes 59c and 59d in the same way as the first IDT electrode 55. Note that, the form shown in FIG. 13 is the case where the first IDT electrode 55 and second IDT electrode 56 do not have first and second dummy electrode fingers 35 and 36 and third and fourth dummy electrode fingers 45 and 46.

Since the reflector electrode 59b and reflector electrode 59c are provided in the region between the first IDT electrode 55 and the second IDT electrode 56 in this way, the acoustic waves generated in the two IDT electrodes can be made harder to interfere with each other. That is, even when the first and second IDT electrodes 55 and 56 are arranged so that the direction of propagation of the acoustic wave of the first IDT electrode 55 and the direction of propagation of the acoustic wave of the second IDT electrode 56 are along each other, the acoustic waves generated in the two IDT electrodes can be made harder to interfere with each other. From another viewpoint, since the acoustic waves generated in the two IDT electrodes do not interfere with each other much at all, the first and second IDT electrodes 55 and 56 can be arranged close to each other.

The first interconnect line 37 or second interconnect line 38 may be arranged so as to pass through a space between the reflector electrode 59b of the first IDT electrode 55 and the reflector electrode 59c of the second IDT electrode 56 as shown in FIG. 13 as well. Note that, FIG. 13A shows a case where the second interconnect line 38 passes through a space between the reflector electrode 59b and the reflector electrode 59c. By passing the interconnect line between the two reflector electrodes 59 in this way, scattering of the acoustic wave generated in the first IDT electrode 55 or second IDT electrode 56 due to the interconnect line can be reduced.

Further, as shown in FIG. 13, since the first interconnect line 37 is arranged on the outer side than the reflector electrode 59d when using the second IDT electrode 56 as a standard, scattering of the acoustic wave generated in the second IDT electrode 56 by the first interconnect line 37 can be reduced. By arranging the interconnect line on the outer side than the reflector electrode in this way, scattering of the acoustic wave can be reduced, therefore superposition of noise on the transmission/reception signal can be reduced.

Further, the method of connecting the first IDT electrode 55 and the second IDT electrode 56 is not limited to the embodiments explained above. The route of the lines becomes a factor influencing the electrical characteristics, size, etc. of the SAW element, therefore it is desirably as short as possible. In order to make the route of the lines shorter, for example, as shown in FIGS. 14A to 14D, a form utilizing the reflector electrodes of the first IDT electrode 55 and second IDT electrode 56 as a portion of the lines or a form sharing the reflector electrode between the first IDT electrode 55 and the second IDT electrode 56 and utilizing that as a line and so on can be considered.

By making the route of the lines short in this way, the area of the SAW resonator S1 occupied in the upper surface of the piezoelectric substrate 30 can be made small. As a result, the duplexer 1 can be made small in size. Note that, when sharing a reflector between the two IDT electrodes as in FIGS. 14A and 14D, it is necessary to make the number of electrode fingers of the reflector large enough to prevent acoustic waves generated in the two IDT electrodes from interfering with each other. Specifically, about 30 to 100 fingers are necessary.

Figure 15:
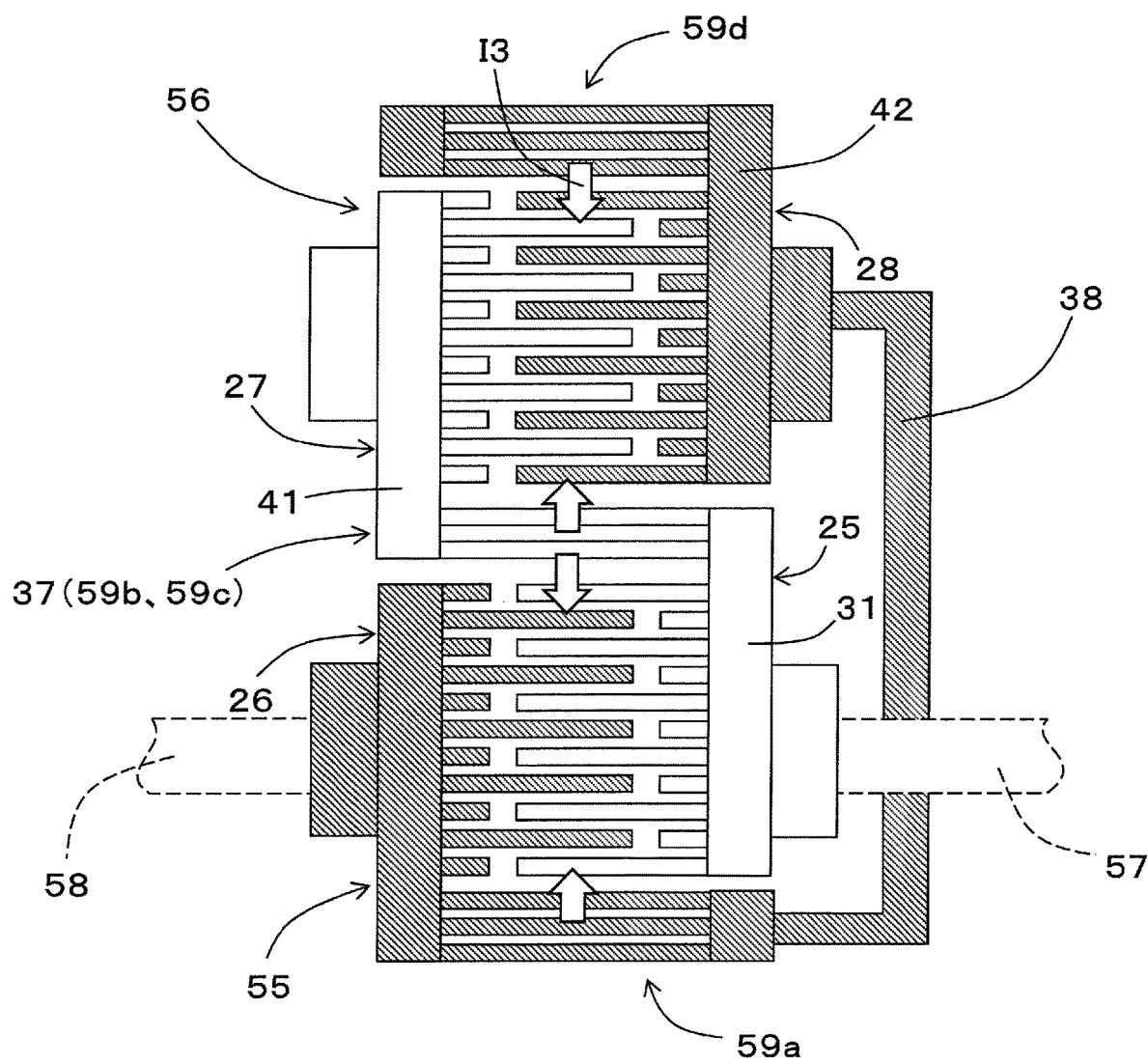
FIG. 15 is an illustration of a plan view which shows a modification of a SAW element according to an embodiment of the disclosure.

Further, the reflector electrodes 59a and 59d which are positioned on the outsides of the first IDT electrode 55 and second IDT electrode 56 may be electrically connected to the first IDT electrode 55 or second IDT electrode 56 as shown in FIG. 15 as well. In FIG. 15, the hatched portions are portions having the same electrical polarity. Note that, portions in which the signal input line 57 and the signal output line 58 are connected are indicated by dotted lines.

In the SAW element 51 shown in FIG. 15, the reflector electrodes 59b and 59c which are arranged between the first IDT electrode 55 and the second IDT electrode 56 shown in FIG. 13A are made a shared reflector electrode 59 which is used as a portion of the first interconnect line 37.

In the present embodiment, the first comb-shaped electrode 25 and the reflector electrodes 59 which are arranged between the first and second IDT electrodes 55 and 56 are connected by using the first bus bar electrode 31. Further, the reflector electrodes 59 which are positioned between the first and second IDT electrodes 55 and 56 and the third comb-shaped electrode 27 are connected by using the third bus bar electrode 41. Further, the second comb-shaped electrode 26 and the fourth comb-shaped electrode 28 are electrically connected through the reflector electrodes 59a. Further, the fourth comb-shaped electrode 28 and the reflector electrodes 59d are electrically connected through the fourth bus bar electrode 42.

In this way, in the first, second, third, and fourth comb-shaped electrodes 25, 26, 27, and 28, in the direction of propagation of the acoustic wave, the electrode fingers which are positioned at the end parts are adjacent to the reflector electrodes 59 etc. having the polarities. For this reason, distorted currents I3 due to the distortion generated in the IDT electrode end parts where the periods of electrode fingers become asymmetric due to the nonlinearity in the thickness (depth) direction can be generated in directions cancelling each other out, therefore the distorted current I3 flowing in the SAW element 51 can be reduced.

Specifically, the distorted wave generated due to the thickness direction is influenced by the polarity of the adjacent electrode finger or reflector electrode. When referring to the first IDT electrode 55 as an example, at each of the first electrode fingers 33 which are positioned at portions other than the end parts of the first comb-shaped electrode 25, second electrode fingers 34 having different polarities are symmetrically adjacent at the two sides, therefore there is almost no distorted wave which is generated due to the thickness direction.

Here, as shown in FIG. 15, at the first electrode fingers 33 which are positioned at the end parts, a second electrode finger 34 is adjacent to one side, while a reflector electrode 59a having the same polarity as that of the second electrode finger 34 is arranged at the other side. For example, when viewing the relationship between the first electrode finger 33 on the reflector electrode 59a side and the reflector electrode 59a, the contact area with the piezoelectric substrate 30 becomes larger in the reflector electrode 59a, so they become asymmetric. For this reason, the cancellation of distortion generated is no longer perfect, therefore a substantial distorted current is generated.

Contrary to this, when viewing the relationship between the second electrode finger 34 on the first interconnect line 37 side and the first interconnect line 37 and first electrode finger 33, the contact area with the piezoelectric substrate 30 is larger in the first interconnect line 37 and first electrode finger 33, so they become asymmetric, therefore a substantial distorted current is generated. Note, the polarity is the inverse direction to that generated at the end part on the reflector electrode 59a side.

For this reason, when viewing this in the first IDT electrode 55, the distorted currents I3 end up cancelling each other out, therefore the influence due to the distortion generated at the end parts of electrode fingers of this first IDT electrode can be reduced. Note that, the same is true also for the second IDT electrode 56. As described above, by adjusting the polarities of the electrode fingers and reflector electrodes, the distorted currents I3 generated at the electrode fingers of the IDT electrodes due to the thickness direction of the piezoelectric substrate 30 can be reduced.

The specific method of adjustment is as follows The first comb-shaped electrode 25 and the third comb-shaped electrode 27 are connected to the same potential (first potential). The second comb-shaped 26 and the fourth comb-shaped electrode 28 are connected to the same potential (second potential). Here, a case where at least one reflector electrode 59 which is adjacent to the IDT 55 or 56 is connected to the first potential or second potential will be studied.

Here, the number of combinations of the reflector electrodes 59 connected to the first potential and the electrode fingers which are positioned at the end parts of the IDTs 55 and 56 which are adjacent to them will be defined as Xa. In the same way, the number of combinations of the reflector electrodes 59 connected to the second potential and the electrode fingers which are positioned at the end parts of the IDTs 55 and 56 which are adjacent to the reflector electrodes 59 will be defined as Xb. In this case, in order to reduce the influence of the distortion generated at the end parts of the electrode fingers, Xa and Xb are made equal.

In the example shown in FIG. 15, Xa becomes 2 due to the combination of the reflector electrode 59b and the electrode finger at the end part of the first IDT 55 which is adjacent to the reflector electrode 59b and the combination of the reflector electrode 59c and the electrode finger at the end part of the second IDT 56 which is adjacent to the reflector electrode 59c. Xb becomes 2 due to the combination of the reflector electrode 59a and the electrode finger at the end part of the first IDT 55 which is adjacent to reflector electrode 59a and the combination of the reflector electrode 59d and the electrode finger at the end part of the second IDT 56 which is adjacent to reflector electrode 59d. By making Xa and Xb equal in this way, the distorted current running from the first potential toward the second potential and the distorted current running from the second potential toward the first potential can be cancelled out by each other.

In this way, Xa and Xb may be made to match each other in order to reduce the influence of the distortion generated at the end parts of the electrode fingers. Therefore, by employing the lines as shown in FIG. 22 and FIG. 23, the reflector electrodes 59 may be used as the interconnect lines for connecting the IDTs to each other like with the first interconnects 37 etc. as well.

Figure 22:
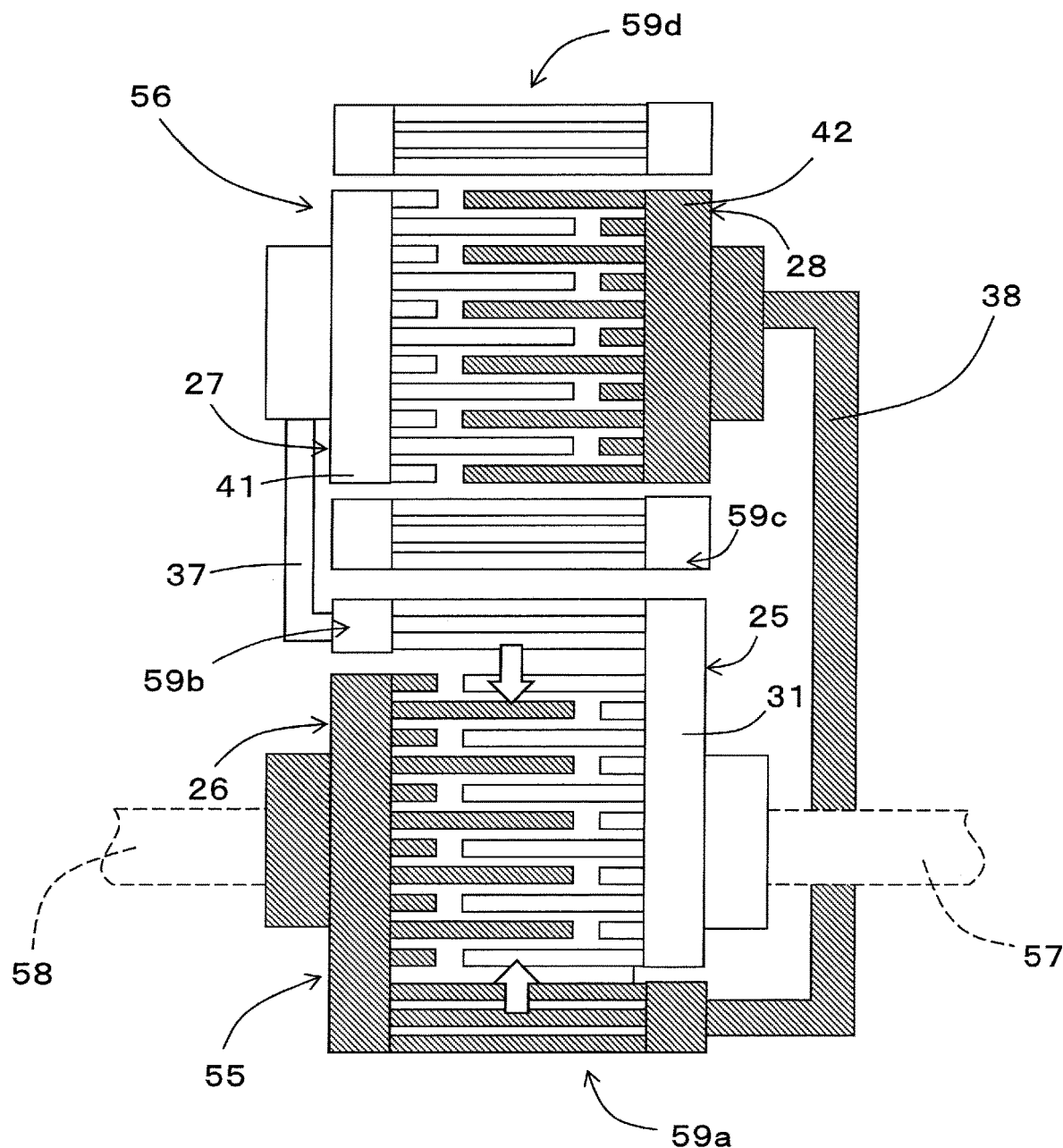
FIG. 22 is an illustration of a plan view which shows a modification of a SAW element according to an embodiment of the disclosure.

The example shown in FIG. 22 shows the case where two reflector electrodes 59 sandwiching the first IDT 55 are connected to the different potentials. In this case, the distorted currents can be cancelled out by each other inside the first IDT 55.

Figure 23:
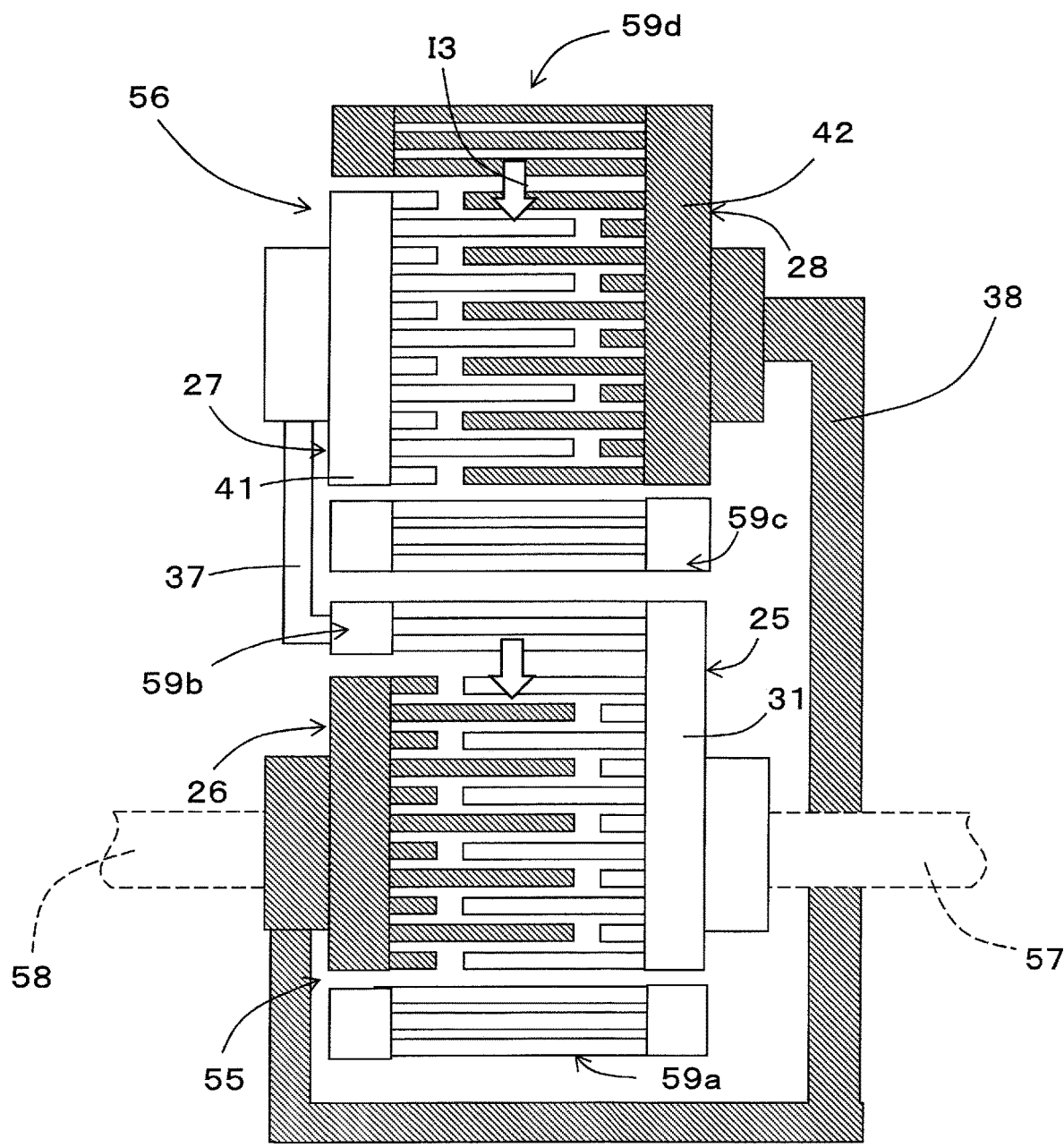
FIG. 23 is an illustration of a plan view which shows a modification of a SAW element according to an embodiment of the disclosure.

In the example shown in FIG. 23, one of the two reflector electrodes 59 sandwiching the first IDT 55 is connected to the second potential, and one of the two reflector electrodes 59 sandwiching the second IDT 56 is connected to the first potential. In this case, the distorted currents can be cancelled out by the combination of the first IDT 55 and the second IDT 56.

Figure 16:
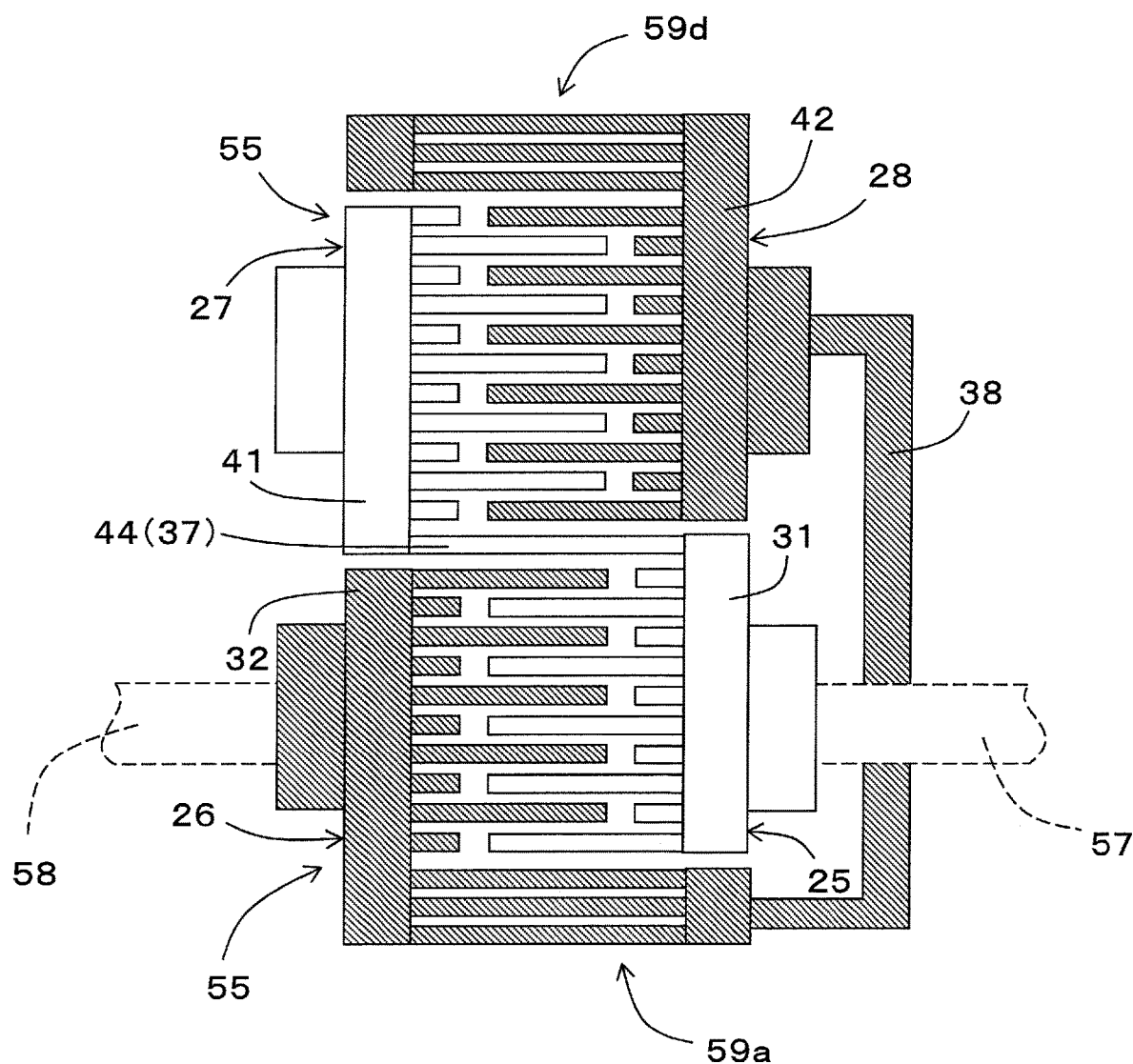
FIG. 16 is an illustration of a plan view which shows a modification of a SAW element according to an embodiment of the disclosure.

Further, in FIG. 15, use was made of the reflector electrode 59 as the second interconnect line 38 for connecting the first IDT electrode 55 and the second IDT electrode 56, but use may be made of a second electrode finger 34 of the second comb-shaped electrode 26 as the second interconnect line 38 as shown in FIG. 16 as well. Note that, the second electrode finger 34 can be grasped as the reflector electrode 59 in a broad sense as well. Further, in FIG. 16, hatched portions are portions which exhibit the same electrical polarity.

By using a portion of a third electrode finger 43 of the third comb-shaped electrode 27 as the first interconnect line 37 in this way, the SAW element 51 can be made smaller in size. Further, by arranging electrode fingers (second electrode finger 34 and fourth electrode finger 43) adjacent to the first interconnect line 37 so as to have a different polarity from that of the first interconnect line 37, phases of the acoustic wave generated in the first IDT electrode 55 and the acoustic wave generated in the second IDT electrode 56 can be matched, therefore interference causing the impedance characteristic to deteriorate can be reduced.

Figure 17:
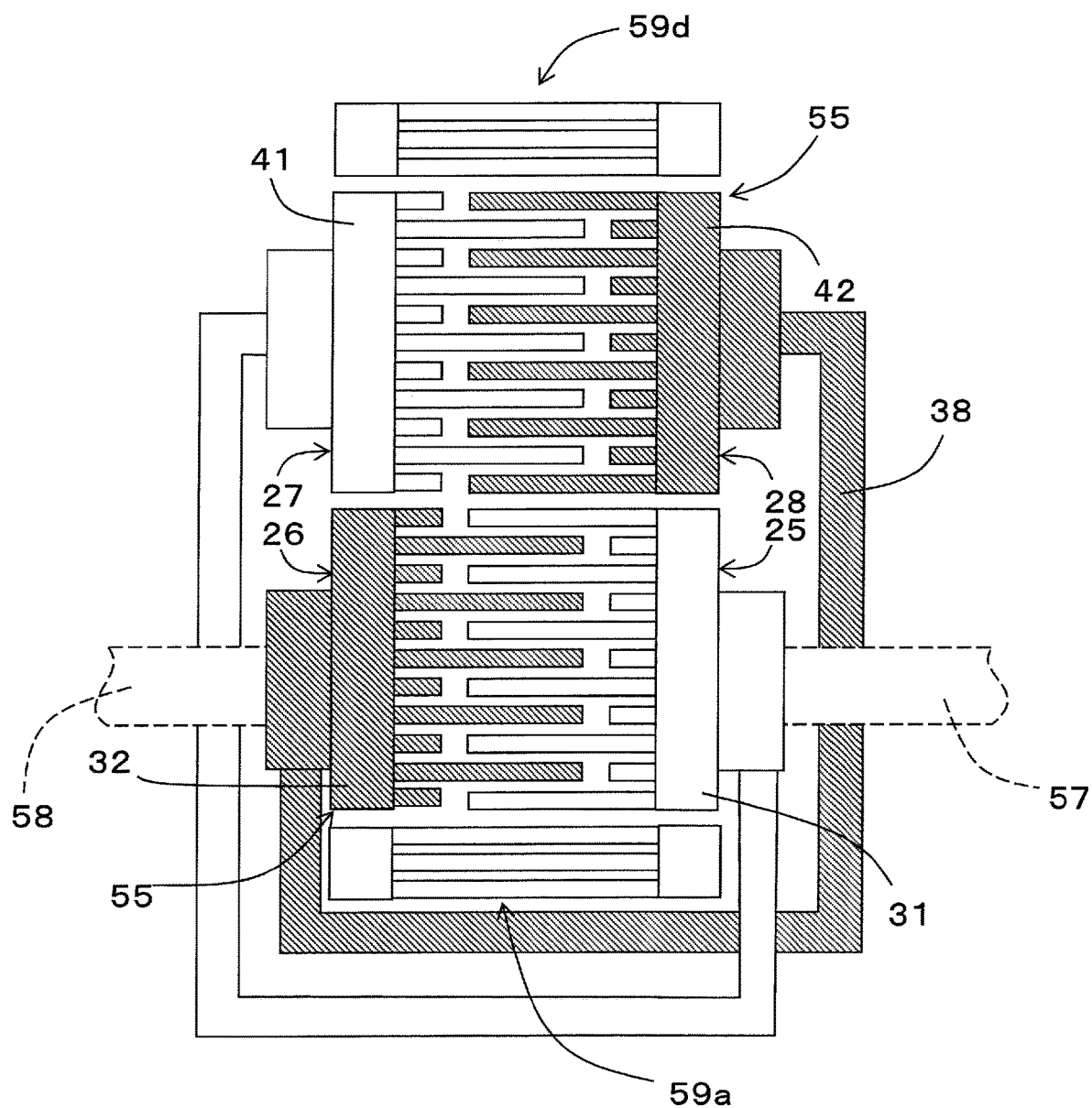
FIG. 17 is an illustration of a plan view which shows a modification of a SAW element according to an embodiment of the disclosure.

Further, as shown in FIG. 17, by adjusting the electrode fingers positioned at the ends of the comb-shaped electrodes, the size can be further reduced. Note that, in FIG. 17, the hatched portions are portions having the same polarity. Specifically, the electrode finger (first electrode finger 33) adjacent to the second IDT electrode 56 in the first IDT electrode 55 and the electrode finger (fourth electrode finger 43) adjacent to the first IDT electrode 55 in the second IDT electrode 56 may be arranged so as to have different polarities. By employing such an arrangement, the phases of the acoustic wave generated in the first IDT electrode 55 and the acoustic wave generated in the second IDT electrode 56 can be matched, therefore interference causing the impedance characteristic to deteriorate can be reduced.

Figure 18:
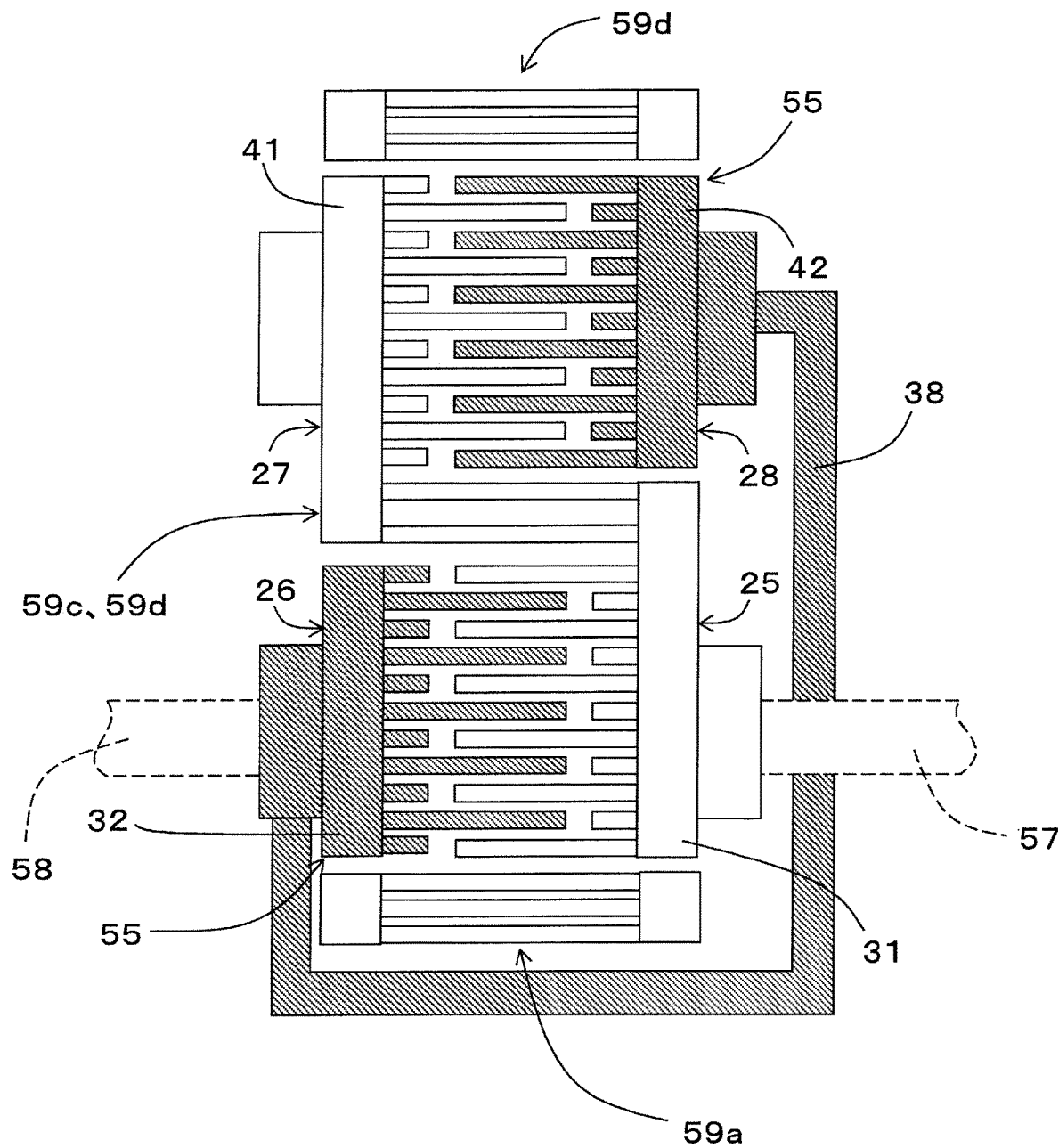
FIG. 18 is an illustration of a plan view which shows a modification of a SAW element according to an embodiment of the disclosure.
Figure 19:
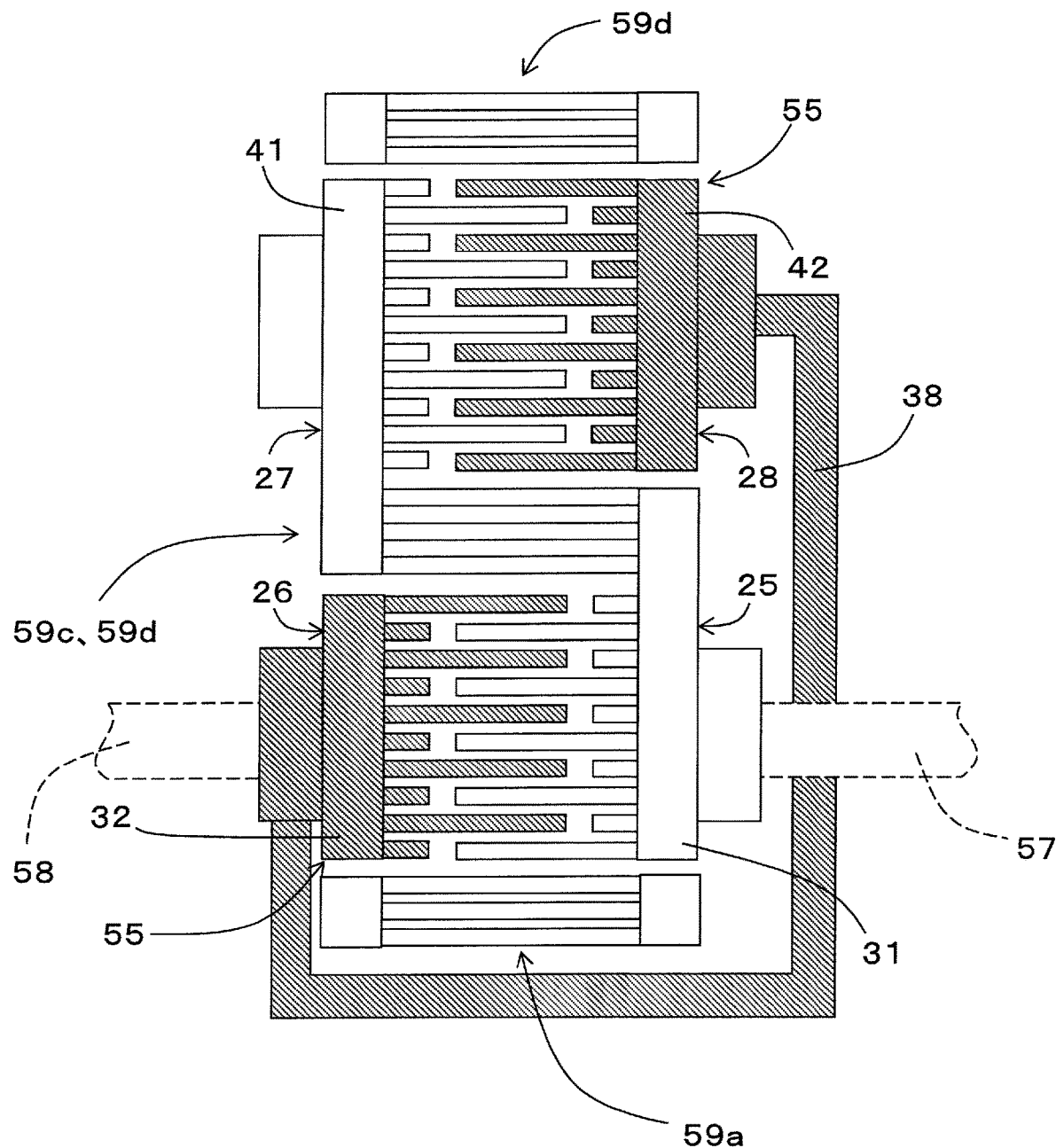
FIG. 19 is an illustration of a plan view which shows a modification of a SAW element according to an embodiment of the disclosure.

Further, as shown in FIGS. 18 and 19, between the first IDT electrode 55 and the second IDT electrode 56, reflector electrodes 59 having a number of electrode fingers smaller than that explained in FIG. 14 may be arranged as well. In this case, the arrangement is made by considering the polarity of the electrode finger on the second IDT electrode 56 side in the first IDT electrode 55 and the polarity of the electrode finger on the first IDT electrode 55 side in the second IDT electrode 56.

Specifically, as shown in FIG. 18, in a case where the polarity of the first electrode finger 33 on the second IDT electrode 56 side in the first IDT electrode 55 and the polarity of the fourth electrode finger 44 on the first IDT electrode 55 side in the second IDT electrode 56 are different, the setting is made so that the number of electrode fingers of the reflector electrodes 59c and 59d which are positioned between the first IDT electrode 55 and the second IDT electrode 56 becomes an even number. By setting in this way, the phases of the acoustic wave generated in the first IDT electrode 55 and the acoustic wave generated in the second IDT electrode 56 can be made to match, therefore interference causing the impedance characteristic to deteriorate can be reduced.

On the other hand, as shown in FIG. 19, in a case where the polarity of the first electrode finger 33 on the second IDT electrode 56 side in the first IDT electrode 55 and the polarity of the fourth electrode finger 44 on the first IDT electrode 55 side in the second IDT electrode 56 are the same, the setting is made so that the number of electrode fingers of the reflector electrodes 59c and 59d which are positioned between the first IDT electrode 55 and the second IDT electrode 56 becomes an odd number. By setting in this way, the phases of the acoustic wave generated in the first IDT electrode 55 and the acoustic wave generated in the second IDT electrode 56 can be made to match, therefore interference causing the impedance characteristic to deteriorate can be reduced.

By using such reflectors for lines connecting two IDT electrodes 55 and 56, the deterioration of impedance characteristic due to the interference of acoustic waves between the two IDT electrodes can be reduced, therefore the number of electrode fingers of the reflectors can be much reduced to a number lower than the 30 to 100 explained in FIG. 14. Specifically, the number can be made 0 (example in FIG. 16) to 30. Due to this, a resonator which is smaller in size, has a smaller distortion generated, and is free from deterioration of impedance characteristic can be provided. In this example, only the case where the two IDT electrodes 55 and 56 were connected in parallel was described. However, as shown in FIG. 14B, the same configuration can be used in the case of connecting them in series as well. In FIG. 14B, the propagation direction of an acoustic wave is shown as y or 201 and a direction crossing the propagation direction is shown as x or 202.

Further, the acoustic wave element is not limited to a SAW element (in a narrow sense). The SAW element may be for example an elastic boundary wave element as well.

Further, in the embodiments explained above, the case where the SAW element had a plurality of resonators and configured a filter circuit was shown, however, for example, it may be configured by only one resonator as well.

The shape of the IDT electrodes is not limited to the illustrated ones. The IDT electrodes may be for example ones which are not provided with dummy electrode fingers as well. Further, they may be ones which are apodized by making the crossing widths of the electrode fingers different along the direction of propagation of the SAW as well. Further, the IDT electrodes may be ones in which the bus bar electrodes are inclined or bent or may be ones in which the sizes of the bus bar electrodes change in the direction (b-direction) perpendicular to the direction of propagation of the acoustic wave (the position in the b-direction of the edge part on the electrode finger side in the bus bar changes). Further, in the IDT electrodes, a portion having electrode fingers with narrower pitch may be provided or a portion in which two or more electrode fingers extending from one comb-shaped electrode are adjacent to each other without an electrode finger extending from another comb-shaped electrode between them may be provided.

Further, in the embodiments explained above, the case where the direction of arrangement from the third comb-shaped electrode 27 toward the fourth comb-shaped electrode 28 was an inverse direction to the direction of arrangement from the first comb-shaped electrode 25 toward the second comb-shaped electrode 26 was shown, but the present disclosure is not limited to that configuration. That is, so long as the direction of arrangement from the third comb-shaped electrode 27 toward the fourth comb-shaped electrode 28 is not the same direction (form in FIG. 4, form in FIG. 8) as the direction of arrangement from the first comb-shaped electrode 25 toward the second comb-shaped electrode 26 (if their directions are different), the effect of reducing the distorted wave is exerted.

Specifically, it is sufficient that the direction of arrangement from the third comb-shaped electrode 27 toward the fourth comb-shaped electrode 28 be offset from the direction of arrangement from the first comb-shaped electrode 25 toward the second comb-shaped electrode 26 even if by a small amount. By arranging them in this way, the effect of cancellation of the distorted currents is exerted, therefore the distorted current output from the SAW element 51 can be reduced.

Figure 20:
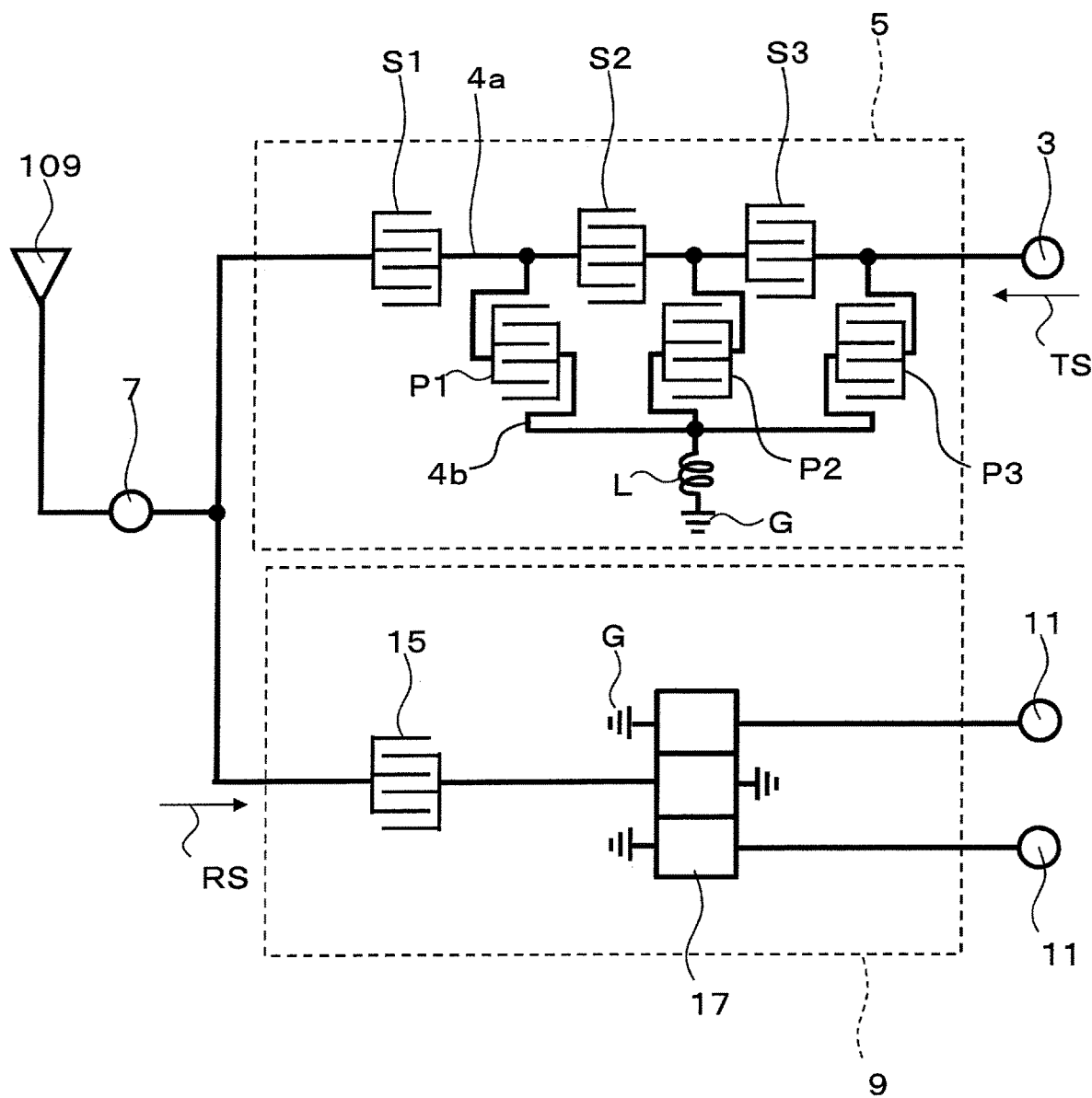
FIG. 20 is an illustration of a diagram which shows a modification of a duplexer according to the first embodiment of the disclosure.

Further, in the embodiments explained above, the SAW element 51 was divided. However, as shown in FIG. 20 and FIG. 21, the distorted wave may be reduced between the serial resonators S1 to S3, parallel resonators P1 to P3 or auxiliary resonator 15 configuring the duplexer 1 as well. Note that, the "division" of the SAW device 51 means that there is substantially no branch structure in a part connecting the two IDTs 55 and 56. However, a branch structure forming an inductor or capacity component by a connection for connecting the two IDTs 55 and 56 or an ultra-micro inductor or capacity component which does not exert an influence upon the characteristics of the resonator is not included in a substantial branch structure.

Specifically, as shown in FIG. 20, the parallel resonator P1 of the transmission filter 5 may be arranged so that the direction of arrangement from the comb-shaped electrode on the signal input side toward the comb-shaped electrode on the signal output side becomes a different direction with respect to the serial resonators S1 to S3. Due to this, the distorted wave generated in the serial resonators S1 to S3 and the distorted wave generated in the parallel resonator P1 can be cancelled by each other. As a result, the distorted wave in the transmission filter 5 can be reduced. Note that, at least one of the parallel resonators P1 to P3 only have to be arranged so that the direction of arrangement from the comb-shaped electrode on the signal input side toward the comb-shaped electrode on the signal output side becomes different with respect to either of the serial resonators S1 to S3.

Figure 21A:
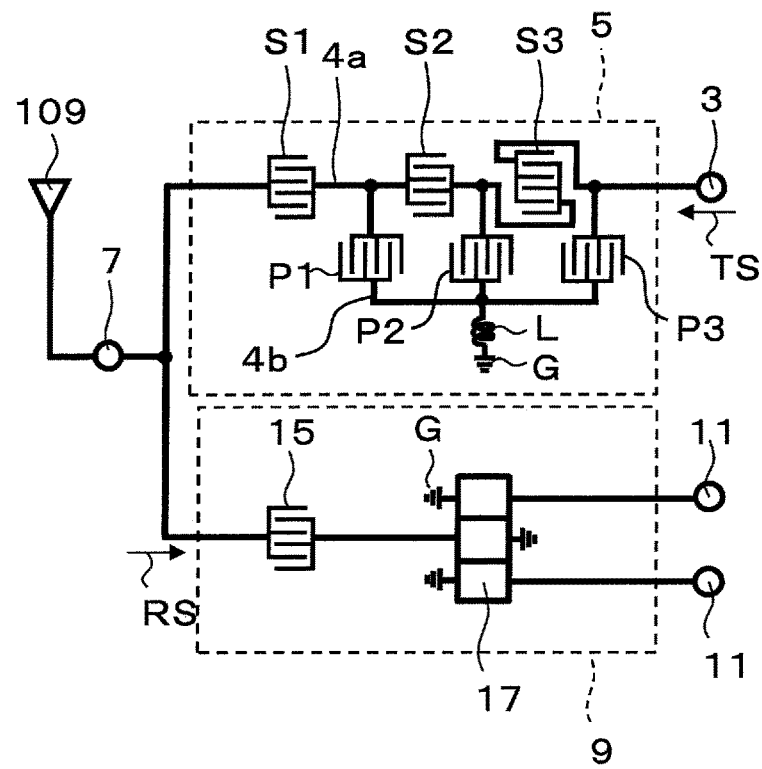
FIGS. 21A and 21B are illustrations of a diagram which shows a modification of a duplexer according to a second embodiment of the disclosure.

Further, as shown in FIG. 21A, the serial resonator S3 may be arranged so that the direction of arrangement from the comb-shaped electrode on the signal input side toward the comb-shaped electrode on the signal output side becomes different with respect to the serial resonator S1 or S2 as well. Note that, in the embodiment shown in FIG. 21A, the SAW device 53 is configured by the serial resonator S2 and serial resonator S3. However, it can be configured by the serial resonator S1 and serial resonator S2. By arranging the components so that the direction of arrangement from the comb-shaped electrode on the signal input side toward the comb-shaped electrode on the signal output side becomes different between two or more serial resonators in this way, a distorted wave can be reduced.

Figure 21B:
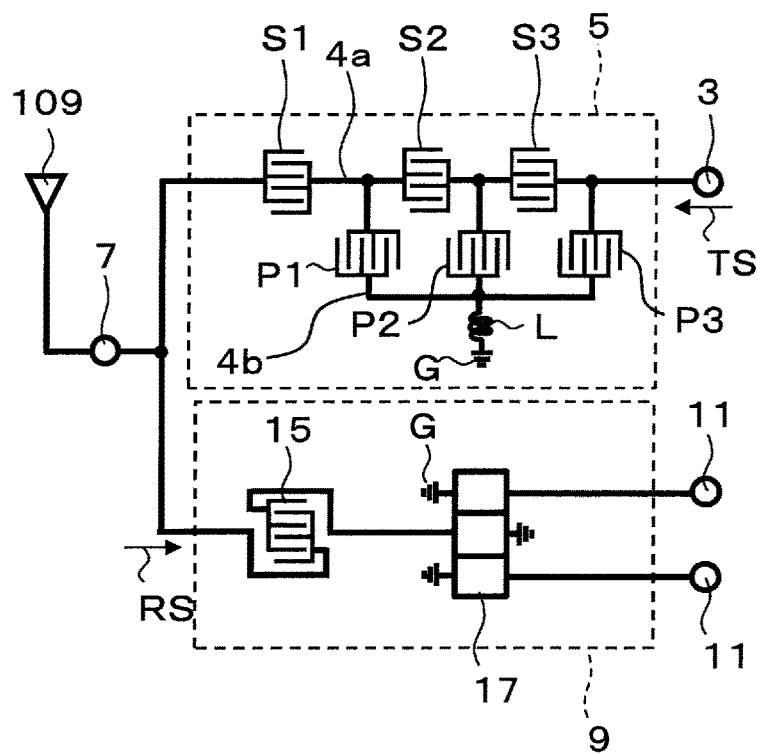

Further, as shown in FIG. 21B, the auxiliary resonator 15 arranged in the reception filter 6 may be arranged so that the direction of arrangement from the comb-shaped electrode on the signal input side toward the comb-shaped electrode on the signal output side becomes different with respect to the serial resonator S1 to S3 of the transmission filter 5 as well. By this as well, the distorted wave can be reduced. Further, the lines of the transmission filter 5 are not changed, therefore the degree of freedom of design of the transmission filter 5 can be raised.

REFERENCE SIGNS LIST

1 . . . duplexer, 21 . . . first gap, 22 . . . second gap, 23 . . . third gap, 24 . . . fourth gap, 25 . . . first comb-shaped electrode, 26 . . . second comb-shaped electrode, 27 . . . third comb-shaped electrode, 28 . . . fourth comb-shaped electrode, 30 . . . piezoelectric substrate, 31 . . . first bus bar electrode, 32 . . . second bus bar electrode, 33 . . . first electrode finger, 34 . . . second electrode finger, 35 . . . first dummy electrode finger, 36 . . . second dummy electrode finger, 41 . . . third bus bar electrode, 42 . . . fourth bus bar electrode, 45 . . . third dummy electrode finger, 46 . . . fourth dummy electrode finger, 51 . . . acoustic wave element (SAW element), 55 . . . first IDT electrode, 56 . . . second IDT electrode, 57 . . . signal input line, 58 . . . signal output line, and 59 . . . reflector electrode.

The invention claimed is:

1. An acoustic wave element, comprising:
a piezoelectric substrate; and
an acoustic wave resonator and comprising
a first IDT electrode and a second IDT electrode each comprising a pair of comb-shaped electrodes on the piezoelectric substrate, and
a first signal line and a second signal line inputting signals into or outputting signals from the first IDT electrode and the second IDT electrode, wherein
the first IDT electrode comprises a first comb-shaped electrode comprising a first bus bar electrode and
a second comb-shaped electrode comprising a second bus bar electrode,
the second IDT electrode comprises
a third comb-shaped electrode comprising a third bus bar electrode and
a fourth comb-shaped electrode comprising a fourth bus bar electrode,
each of the first bus bar electrode and second bus bar electrode is continuous in a propagation direction of an acoustic wave without interruption, one end of each of the first bus bar electrode and second bus bar electrode being adjacent to a first reflector electrode and the other end of each of the first bus bar electrode and second bus bar electrode being adjacent to a second reflector electrode, each of the third bus bar electrode and fourth bus bar electrode is continuous in the propagation direction without interruption, one end of each of the third bus bar electrode and forth bus bar electrode being adjacent to a third reflector electrode and the other end of each of the third bus bar electrode and fourth bus bar electrode being adjacent to a fourth reflector electrode,
the first IDT electrode and the second IDT electrode are arranged in a crossing direction crossing the propagation direction so that in the crossing direction, the second bus bar electrode and the first bus bar electrode are located on a side of the second IDT electrode, the fourth bus bar electrode and the third bus bar electrode are located on a side of the first IDT electrode, and the second and four bus bar electrodes facing each other,
the first signal line connects to the first and third bus bar through a conductor, and
the second signal line connects to the second and fourth bus bar through a conductor.

2. The acoustic wave element according to claim 1, wherein
the second bus bar and the fourth bus bar are directly connected.

3. The acoustic wave element according to claim 1, wherein
the first IDT electrode and the second IDT electrode each comprises a plurality of electrode fingers,
numbers of the plurality of electrode fingers, pitches of the plurality of electrode fingers and crossing widths of the plurality of electrode fingers are same between the first IDT electrode and the second IDT electrode.

4. An acoustic wave element, comprising:
a piezoelectric substrate; and
an acoustic wave resonator and comprising
a first IDT electrode and a second IDT electrode each comprising a pair of comb-shaped electrodes on the piezoelectric substrate, and
a first signal line and a second signal line inputting signals into or outputting signals from the first IDT electrode and the second IDT electrode, wherein
the first IDT electrode comprises
a first comb-shaped electrode comprising a first bus bar electrode and
a second comb-shaped electrode comprising a second bus bar electrode, the second IDT electrode comprises
a third comb-shaped electrode comprising a third bus bar electrode and
a fourth comb-shaped electrode comprising a fourth bus bar electrode,
each of the first bus bar electrode and second bus bar electrode is continuous in a propagation direction of an acoustic wave without interruption, one end of each of the first bus bar electrode and second bus bar electrode being adjacent to a first reflector electrode and the other end of each of the first bus bar electrode and second bus bar electrode being adjacent to a second reflector electrode,
each of the third bus bar electrode and fourth bus bar electrode is continuous in the propagation direction without interruption, one end of each of the third bus bar electrode and forth bus bar electrode being adjacent to a third reflector electrode and the other end of each of the third bus bar electrode and fourth bus bar electrode being adjacent to a fourth reflector electrode,
the first IDT electrode and the second IDT electrode are arranged in a crossing direction crossing the propagation direction so that in the crossing direction, the second bus bar electrode and the first bus bar electrode are is located on a side of the second IDT electrode, the fourth bus bar electrode and the third bus bar electrode are located on a side of the first IDT electrode, and the second and four bus bar electrodes facing each other,
the first signal line connects to the first and third bus bar electrodes through a conductor, the second signal line connects to the second and fourth bus bar electrodes through a conductor, and at least one of the first signal line and the second signal line is connected with at least one of the reflector electrodes through a conductor.

\* \* \* \* \*